(12) United States Patent
Naka et al.

(10) Patent No.: US 12,200,953 B2
(45) Date of Patent: Jan. 14, 2025

(54) LIGHT-EMITTING DEVICE

(71) Applicant: SHARP KABUSHIKI KAISHA, Sakai (JP)

(72) Inventors: Takayuki Naka, Sakai (JP); Yoshihiro Ueta, Sakai (JP); Noboru Iwata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 438 days.

(21) Appl. No.: 17/781,336

(22) PCT Filed: Dec. 4, 2019

(86) PCT No.: PCT/JP2019/047493
§ 371 (c)(1),
(2) Date: May 31, 2022

(87) PCT Pub. No.: WO2021/111556
PCT Pub. Date: Jun. 10, 2021

(65) Prior Publication Data
US 2023/0006166 A1 Jan. 5, 2023

(51) Int. Cl.
*H01L 51/50* (2006.01)
*H10K 50/115* (2023.01)
*H10K 50/17* (2023.01)
*H10K 59/35* (2023.01)
*H10K 85/10* (2023.01)
*H10K 50/15* (2023.01)
*H10K 102/00* (2023.01)

(52) U.S. Cl.
CPC ........... *H10K 50/17* (2023.02); *H10K 50/115* (2023.02); *H10K 59/35* (2023.02); *H10K 85/111* (2023.02); *H10K 85/114* (2023.02); *H10K 50/15* (2023.02); *H10K 2102/00* (2023.02)

(58) Field of Classification Search
None
See application file for complete search history.

(56) References Cited

U.S. PATENT DOCUMENTS

2020/0411785 A1    12/2020  Kanehiro
2021/0126216 A1     4/2021  Umeda et al.

FOREIGN PATENT DOCUMENTS

| CN | 105261707 A | 1/2016 |
| WO | 2019/171503 A1 | 9/2019 |
| WO | 2019/186847 A1 | 10/2019 |

OTHER PUBLICATIONS

Huaibin Shen et al., "High-Efficiency, Low Turn-on Voltage Blue-Violet Quantum-Dot-Based Light-Emitting Diodes", Nano Lett., 2015, 15, pp. 1211-1216.
Ting Wang et al., "Influence of Shell Thickness on the Performance of NiO-Based All-Inorganic Quantum Dot Light-Emitting Diodes", ACS Appl. Mater. Interfaces, 2018, 10, pp. 14894-14900.

*Primary Examiner* — Anthony Ho
(74) *Attorney, Agent, or Firm* — ScienBiziP, P.C.

(57) ABSTRACT

A light-emitting device includes an HTL including a metal chalcogenide between an anode and an EML, with an IL including an organic material at least between the HTL and the EML. A distance between the HTL and the EML in a light-emitting element that emits light in a wavelength band having the shortest light emission peak wavelength is greater than a distance between the HTL and the EML in each of the other light-emitting elements.

19 Claims, 8 Drawing Sheets

LIGHT-EMITTING DEVICE

TECHNICAL FIELD

The disclosure relates to a light-emitting device.

Related Art

Shen, Huaibin, et al., "High-Efficiency, Low Turn-on Voltage Blue-Violet Quantum-Dot-Based Light-Emitting Diodes," Nano Lett., 2015, 15, 1211-1216 discloses that, in a light-emitting element that uses blue quantum dots in a light-emitting layer and organic materials in a hole injection layer and a hole transport layer, a quantum efficiency can be improved by replacing ligands of the blue quantum dots with shorter ligands.

Further, Wang Ting et al., "Influence of Shell Thickness on the Performance of NiO-Based All-Inorganic Quantum Dot Light-Emitting Diodes," ACS Appl. Mater. Interfaces, 2018, 10, 14894-14900 discloses that, in a light-emitting element that uses green quantum dots in a light-emitting layer and nickel oxide (NiO) in a hole transport layer, light emission quenching and device performance degradation can be suppressed by increasing a thickness of shells of the green quantum dots.

Thus, in Shen, Huaibin, et al., "High-Efficiency, Low Turn-on Voltage Blue-Violet Quantum-Dot-Based Light-Emitting Diodes," Nano Lett., 2015, 15, 1211-1216, a distance from a carrier transport layer to a quantum dot core is shortened to improve the characteristics of the light-emitting element. On the other hand, in Wang. Ting, et al "Influence of Shell Thickness on the Performance of NiO-Based All-Inorganic Quantum Dot Light-Emitting Diodes." ACS Appl. Mater. Interfaces, 2018, 10, 14894-14900, contrary to Shen, Huaibin, et al., "High-Efficiency, Low Turn-on Voltage Blue-Violet Quantum-Dot-Based Light-Emitting Diodes," Nano Lett . . . 2015, 15, 1211-1216, the distance from the carrier transport layer to the quantum dot core is lengthened to improve the characteristics of the light-emitting element.

Note that Shen, Huaibin, et al . . . "High-Efficiency, Low Turn-on Voltage Blue-Violet Quantum-Dot-Based Light-Emitting Diodes," Nano Lett., 2015, 15, 1211-1216 uses a common organic material for the hole injection layer and the hole transport layer, as described above. On the other hand, Wang, Ting, et al. "Influence of Shell Thickness on the Performance of NiO-Based All-Inorganic Quantum Dot Light-Emitting Diodes," ACS Appl. Mater. Interfaces, 2018, 10, 14894-14900 uses NiO for the hole transport layer as described above. NiO is a type of metal chalcogenide (metal oxide, metal sulfide, or the like).

Nevertheless, as a result of extensive studies by the inventors of the present application, the inventors of the present application found the following problem. That is, in a light-emitting device including light-emitting elements having different light emission wavelengths, when a metal chalcogenide is used in a layer having hole transport properties and the thickness of the quantum dot shell in each light-emitting element is increased, a luminance of the light-emitting element that emits light in a wavelength band having the shortest light emission peak wavelength lowers.

Therefore, an object of an aspect of the disclosure is to achieve, in a light-emitting device including light-emitting elements, each provided with a layer including a metal chalcogenide having hole transport properties, a balance in luminance between a light-emitting element that emits light in a wavelength band having the shortest light emission peak wavelength and the other light-emitting elements.

To solve the problem described above, a light-emitting device according to an aspect of the disclosure includes a plurality of types of light-emitting elements each having a light emission peak wavelength in a different wavelength band. The plurality of types of light-emitting elements each include, in this order, an anode, a light-emitting layer including quantum dots, and a cathode, a layer having hole transport properties and including a metal chalcogenide being between the anode and the light-emitting layer, and an intermediate layer including an organic material being between the light-emitting layer and at least the layer including the metal chalcogenide of, among the plurality of types of light-emitting elements, a light-emitting element that emits light in a wavelength band having the shortest light emission peak wavelength. A distance between the light-emitting layer and the layer including the metal chalcogenide of, among the plurality of types of light-emitting elements, the light-emitting element that emits light in a wavelength band having the shortest light emission peak wavelength is greater than a distance between the light-emitting layer and the layer including the metal chalcogenide of each of the other light-emitting elements.

According to an aspect of the disclosure, it is possible to provide a light-emitting device that includes light-emitting elements, each provided with a layer including a metal chalcogenide having hole transport properties, and is capable of achieving a balance in luminance between a light-emitting element that emits light in a wavelength band having the shortest light emission peak wavelength and the other light-emitting elements.

DESCRIPTION OF EMBODIMENTS

First Embodiment

Hereinafter, an embodiment of the disclosure will be described. In addition, a "lower layer" means a layer that is formed in a process prior to that of a comparison layer, and an "upper layer" means a layer that is formed in a process after that of a comparison layer.

Figure 1:
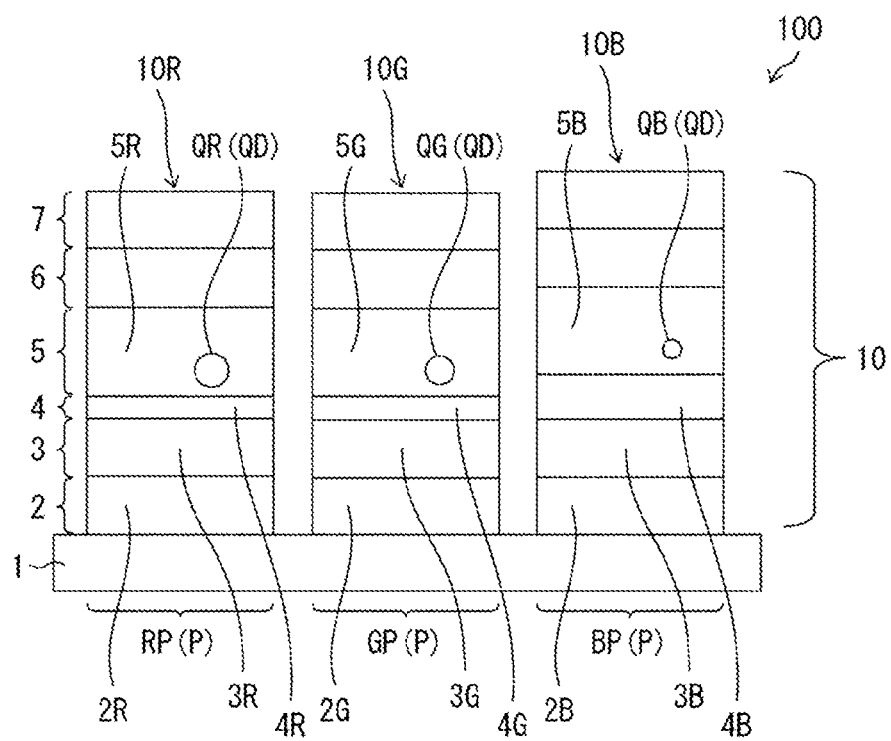
FIG. 1 is a diagram schematically illustrating an example of a layered structure of a light-emitting device according to a first embodiment.

FIG. 1 is a diagram schematically illustrating an example of a layered structure of a light-emitting device 100 according to the present embodiment.

As illustrated in FIG. 1, the light-emitting device 100 includes an array substrate 1 as a support body, and a plurality of types of light-emitting elements 10, each having a light emission peak wavelength in a different wavelength band. The light-emitting device 100 has a structure in which each layer of the light-emitting element 10 is layered on the array substrate 1 in which a thin film transistor (TFT; not illustrated) is formed. Note that, in the disclosure, a direction from the array substrate 1 side toward the light-emitting element 10 side is referred to as "upward", and a direction from the light-emitting element 10 side toward the array substrate 1 side is referred to as "downward".

The light-emitting device 100 is a display device (QLED display) including, as light-emitting elements 10, quantum dot light-emitting diodes (hereinafter referred to as "QLED") that use quantum dots (semiconductor nanoparticles) QD as a light-emitting material. The light-emitting device 100 includes a plurality of pixels P, and includes the light-emitting element 10 corresponding to the pixel P for each of the pixels P.

The light-emitting element 10 includes an anode 2, a light-emitting layer (hereinafter referred to as "EML") 5, and a cathode 7, in this order. Between the anode 2 and EML 5, a hole transport layer (hereinafter referred to as "HTL") 3 is provided as a layer having hole transport properties and including a metal chalcogenide. Between the HTL 3 and the EML 5, an insulating layer (hereinafter referred to as "IL") 4 including an organic material is provided as an intermediate layer between the HTL 3 and the EML 5. Note that, between the EML 5 and the cathode 7, an electron transport layer (hereinafter referred to as "ETL") 6 may be provided as a layer having electron transport properties.

The light-emitting element 10 illustrated in FIG. 1 includes the anode 2, the HTL 3, the IL 4, the EML 5, the ETL 6, and the cathode 7 in this order from the array substrate 1 side (that is, lower layer side).

The anode 2, the HTL 3, the IL 4, and the EML 5 are each separated into an island shape for each pixel P by a bank (not illustrated). As a result, in the light-emitting device 100, a plurality of the QLEDs are provided correspondingly to the pixels P as the light-emitting elements 10.

The bank described above functions as a pixel separation wall as well as an edge cover covering each edge of anodes 2R, 2G, 2B. An insulating material such as an acrylic resin or a polyimide resin, for example, is used in the bank described above.

The light-emitting device 100 illustrated in FIG. 1 includes a pixel RP that is red, a pixel GP that is green, and a pixel BP that is blue as the pixels P. In the pixel RP, a light-emitting element 10R that emits red light (red light-emitting element) is provided as the light-emitting element 10. In the pixel GP that is green, a light-emitting element 10G that emits green light (green light-emitting element) is provided as the light-emitting element 10. In the pixel BP that is blue, a light-emitting element 10B that emits blue light (blue light-emitting element) is provided as the light-emitting element 10.

Hereafter, the anodes 2 having island shapes separated from each other in a corresponding manner to the pixel RP, the pixel GP, and the pixel BP by the bank described above are respectively referred to as the anode 2R, the anode 2G, and the anode 2B. Similarly, the HTLs 3 having island shapes separated from each other in a corresponding manner to the pixel RP, the pixel GP, and the pixel BP by the bank described above are respectively referred to as an HTL 3R, an HTL 3G, and an HTL 3B. The ILs 4 having island shapes separated from each other in a corresponding manner to the pixel RP, the pixel GP, and the pixel BP by the bank described above are respectively referred to as an IL 4R, an IL 4G, and an IL 4B. The EMLs 5 having island shapes separated from each other in a corresponding manner to the pixel RP, the pixel GP, and the pixel BP by the bank described above are respectively referred to as an EML 5R, an EML 5G, and an EML 5B. Note that the ETL 6 and the cathode 7 are not separated by the bank described above, and are formed in solid-like shapes in a display region as common layers common to all pixels P.

The light-emitting element 10R is formed by the anode 2R, the HTL 3R, the IL 4R, and the EML 5R, each having an island shape, and the ETL 6 and the cathode 7, each being a common layer. The light-emitting element 10G is formed by the anode 2G, the HTL 3G, the IL 4G, and the EML 5G, each having an island shape, and the ETL 6 and the cathode 7, each being a common layer. The light-emitting element 10B is formed by the anode 2B, the HTL 3B, the IL 4B, and the EML 5B, each having an island shape, and the ETL 6 and the cathode 7, each being a common layer.

The anodes 2R, 2G, 2B, which are lower electrodes formed on the array substrate 1, are pattern anodes provided for each pixel P and are respectively electrically connected to the TFTs of the array substrate 1. On the other hand, the cathode 7, which is an upper electrode, is a common cathode common to all pixels P.

Each layer of the light-emitting elements 10R, 10G, 10B may be formed of the same material in layers corresponding to one another in the light-emitting elements 10R, 10G, 10B, with the exception of the EMLs 5R, 5G, 5B.

The EML 5R includes, as the quantum dot QD, a quantum dot QR that emits red light. The EML 5G includes, as the quantum dot QD, a quantum dot QG that emits green light. The EML 5B includes, as the quantum dot QD, a quantum dot QB that emits blue light.

Note that, in the disclosure, the red light refers to light having a light emission peak wavelength in a wavelength band from 600 nm to 780 nm. The green light refers to light having a light emission peak wavelength in a wavelength band from 500 nm to 600 nm. The blue light refers to light having a light emission peak wavelength in a wavelength band from 400 nm to than 500 nm.

The light-emitting element 10R preferably has a light emission peak wavelength in a wavelength band from 620 nm to 650 nm. The light-emitting element 10G preferably has a light emission peak wavelength in a wavelength band from 520 nm to 540 nm. The light-emitting element 10B preferably has a light emission peak wavelength in a wavelength band from 440 nm to 460 nm.

However, the configuration described above is an example, and the configuration of the light-emitting device 100 is not necessarily limited to the configuration described above. The light-emitting device 100 may include, as the light-emitting element 10, a light-emitting element that emits light having a light emission peak wavelength in a wavelength band other than the wavelength bands described above. The ETL 6 may be separated into an island shape for each pixel P by the bank described above. The layered order from the anode 2 to the cathode 7 may be reversed. Accordingly, the light-emitting element 10 may include the anode 2, the HTL 3, the IL 4, the EML 5, the ETL 6, and the cathode 7 in this order from the upper layer side. In a case in which the cathode 7 is the lower electrode formed on the array substrate 1, the cathode 7 is electrically connected to the TFT of the array substrate 1 as a pattern cathode. On the other hand, the anode 2 serving as the upper electrode is used as a common anode common to all pixels P. Hereinafter, a case in which the light-emitting device 100 has the configuration illustrated in FIG. 1 will be described as an example.

Note that, when there is no need to distinguish the light-emitting elements 10R, 10G, 10B from one another, these light-emitting elements 10R, 10G, 10B are collectively referred to simply as the "light-emitting element 10" as described above. Similarly, when there is no need to distinguish the pixels RP, GP, BP from one another, these pixels RP, GP, BP are collectively referred to simply as the "pixel P". When there is no need to distinguish the anodes 2R, 2G, 2B from one another, these anodes 2R, 2G, 2B are collectively referred to simply as the "anode 2". When there is no need to distinguish the HTLs 3R, 3G, 3B from one another, these HTLs 3R, 3G, 3B are collectively referred to simply as the "HTL 3". When there is no need to distinguish the ILs 4R, 4G, 4B from one another, these ILs 4R, 4G, 4B are collectively referred to simply as the "IL 4". When there is no need to distinguish the EMLs 5R, 5G, 5B from one another, these EMLs 5R, 5G, 5B are collectively referred to simply as the "EML 5". When there is no need to distinguish the quantum dots QR, QG, QB from one another, these quantum dots QR, QG, QB are collectively referred to simply as the "quantum dot QD".

The anode 2 is formed of a conductive material, and has a function as a hole injection layer (hereinafter referred to as "HIL") for injecting a positive hole into the HTL 3. The cathode 7 is formed of a conductive material and has a function as an electron injection layer (hereinafter referred to as "EIL") for injecting an electron into the ETL 6.

One of the anode 2 and the cathode 7 is made of a light-transmissive material. Note that one of the anode 2 and the cathode 7 may be formed of a light-reflective material. In a case in which the light-emitting device 100 is a top-emitting-type light-emitting device, the cathode 7 being an upper layer is formed of a light-transmissive material, and the anode 2 being a lower layer is formed of a light-reflective material. In a case in which the light-emitting device 100 is a bottom-emitting-type light-emitting device, the cathode 7 being an upper layer is formed of a light-reflective material, and the anode 2 being a lower layer is formed of a light-transmissive material.

As the light-transmissive material, a transparent conductive material can be used, for example. Specifically, for example, indium tin oxide (ITO), indium zinc oxide (IZO), tin oxide ($SnO_2$), or fluorine-doped tin oxide (FTO) can be used as the light-transmissive material. These materials have a high transmittance of visible light, and thus luminous efficiency is improved.

As the light-reflective material, a metal material can be used, for example. Specifically, for example, aluminum (Al), silver (Ag), copper (Cu), or gold (Au) can be used as the light-reflective material. These materials have a high reflectivity of visible light, and thus luminous efficiency is improved.

Further, an electrode having light reflectivity obtained by making either one of the anode 2 or the cathode 7 a layered body including a light-transmissive material and a light-reflective material may be used.

The anode 2 and the cathode 7 can be formed using various methods known as the related art as formation methods of the anode 2 and the cathode 7, such as sputtering or a vacuum vapor deposition technique, for example.

The ETL 6 transports electrons to the EML 5. Note that the ETL 6 may have a function of inhibiting the transport of positive holes. Further, the ETL 6 may also serve as an EIL that promotes the injection of electrons from the cathode 7 into the EML 5. In a case in which a layer having electron transport properties is provided between the cathode 7 and the EML 5, the light-emitting element 10 may include the EIL and the ETL 6 in this order from the cathode 7 side, or may include only the ETL 6.

A known electron transport material can be used for the ETL 6. Examples of the electron transport material include zinc oxide (for example, ZnO), titanium oxide (for example, $TiO_2$), and strontium oxide titanium (for example, $SrTiO_3$). One type of these electron transport materials may be used, or two or more types thereof may be mixed and used as appropriate. Further, nanoparticles may be used for the electron transport material described above.

The HTL 3 transports positive holes to the EML 5 via the IL 4. Note that the HTL 3 may have a function of inhibiting the transport of electrons. Further, the HTL 3 may also serve as an HIL that promotes the injection of positive holes from the anode 2 into the EML 5.

The HTL 3 is a layer having hole transport properties and including a metal chalcogenide, as previously described. Note that the HTL 3 mainly includes a metal chalcogenide, but may further include other materials. Metal chalcogenides have particularly high durability, even among inorganic materials. Examples of metal chalcogenides include nickel oxide (for example, NiO), copper oxide (for example, $Cu_2O$), and copper sulfide (for example, CuS). One type of these metal chalcogenides may be used, or two or more types thereof may be mixed and used as appropriate. Accordingly, the metal chalcogenide described above is at least one type selected from the group consisting of nickel oxide, copper oxide, and copper sulfide.

The HTL 3 can be formed by, for example, a sol-gel method, sputtering, chemical vapor deposition (CVD), or a spin coating method (application method).

The IL 4 is provided between the HTL 3 and the EML 5, in contact with the HTL 3 and the EML 5. Note that the IL 4 mainly includes an organic material, but may further include other materials.

The IL 4 is formed using an insulating material capable of being uniformly layered in a manufacturing process without any loss due to dissolution of the lower layer or any trouble such as repelling during material application to the lower layer. As the insulating material described above, an organic material that is not a good conductor is desirable, and an organic material that does not include a hydroxyl group is even more desirable. Further, to suppress an overflow of electrons from the EML 5 to the HTL 3, an electron affinity value of the IL 4 is preferably smaller than an electron affinity value of the EML 5 by 0.5 eV or greater. Furthermore, an ionization potential value of the IL 4 is desirably greater than a value obtained by subtracting 0.5 eV from an ionization potential value of the EML 5 because such a value facilitates the injection of positive holes from the HTL 3 into the EML 5.

That is, given $EA_{IL}$ as the electron affinity of the IL 4 and $EA_{EML}$ as the electron affinity of the EML 5, then preferably $EA_{IL} \leq EA_{EML} - 0.5$ eV. Further, given $IP_{IL}$ as the ionization potential of the IL 4 and $IP_{EML}$ as the ionization potential of the EML 5, then preferably $IP_{IL} \geq IP_{EML} - 0.5$ eV.

Examples of such an insulating material include polymethyl methacrylate (abbreviation: PMMA), polyvinyl pyrrolidone (abbreviation: PVP), and poly[(9,9-bis(3'-(N,N-dimethylamino)propyl)-2,7-fluorene)-alt-2,7-(9,9-dioctylfluorene)] (abbreviation: PFN). One type of these insulating materials may be used, or two or more types thereof may be mixed and used as appropriate. Accordingly, the IL 4 may be formed of at least one type of insulating material selected from the group consisting of PMMA, PVP, and PFN.

As an example, the electron affinities, the ionization potentials, and band gaps of the PMMA, PVP, and PFN are shown in Table 1. The band gap corresponds to the difference between the ionization potential and the electron affinity of the layer.

TABLE 1

| Material | Electron affinity $EA_{IL}$ (eV) | Ionization potential $IP_{IL}$ (eV) | Band gap (eV) |
|---|---|---|---|
| PMMA | 2.6 | 5.8 | 3.2 |
| PVA | 2.0 | 5.9 | 3.9 |
| PFN | 2.1 | 5.6 | 3.5 |

The IL 4 can be formed by, for example, a spin coating method (application method), a dip coating method, or an ink-jet method.

As mentioned above, metal chalcogenides have durability. Further, as described above, a light-emitting device that uses the quantum dots QD in the EML, unlike a light-emitting device that uses an organic EL in the EML, can be manufactured at low cost by a manufacturing process that does not use a high-vacuum device. Nevertheless, when a metal chalcogenide is used for the HTL and a light-emitting device that uses the quantum dots QD as described above is manufactured by a manufacturing process that does not use a high-vacuum device, the metal chalcogenide surface may be exposed by a gas containing moisture. When the metal chalcogenide surface is even slightly exposed to a gas containing moisture, a hydroxyl group is presumably adsorbed on the metal chalcogenide surface.

In particular, from the perspective of versatility of a manufacturing apparatus, desirably the manufacturing apparatuses of each layer in the light-emitting element 10 are separated from each other. Accordingly, desirably the manufacturing apparatus of the HTL 3 and the film formation apparatus used in the next process (that is, manufacturing apparatus of the layer formed on the HTL 3) are separated from each other. Nevertheless, when the HTL 3 is formed and subsequently the substrate on which the HTL 3 is formed is transported to the manufacturing apparatus separated from the manufacturing apparatus of the HTL 3, the substrate on which the HTL 3 is formed is exposed to the atmosphere between the two manufacturing apparatuses.

Thus, although the manufacturing process of the light-emitting device 100 includes a process in which the metal chalcogenide surface of the HTL 3 is exposed to a gas containing moisture, from the standpoint of the versatility of the manufacturing apparatus, desirably the manufacturing apparatuses of each layer in the light-emitting element 10 are separated from each other. Then, in the process in which the metal chalcogenide surface of the HTL 3 is exposed to a gas containing moisture, the hydroxyl group is presumably adsorbed on the surface of the metal chalcogenide. Accordingly, the manufacturing process of the light-emitting device 100 including a process in which the metal chalcogenide surface of the HTL 3 is exposed to a gas containing moisture presumably means that the manufacturing process of the light-emitting device 100 includes a process in which a hydroxyl group is adsorbed on the surface of the metal chalcogenide.

The IL 4 suppresses charging of the quantum dots QD by the hydroxyl group on the metal chalcogenide surface, and suppresses a decrease in light-emission characteristics caused by the charging of the quantum dots QD.

Further, the IL 4 has the effect of controlling the transport of positive holes from the HTL 3 to the EML 5 and inhibiting the transport of electrons injected from cathode 7. This makes it possible to increase a recombination efficiency of the positive holes and the electrons within the EML 5 and thus improve luminous efficiency.

The EML 5 is a layer that includes a light-emitting material and emits light due to the occurrence of recombination between electrons transported from the cathode 7 and positive holes transported from the anode 2. The light-emitting device 100 includes, in each pixel P, the quantum dots QD layered in a plurality of layers as a light-emitting material.

The method of forming the EML 5 is not particularly limited, but a solvolysis method is suitably used instead of, for example, crystal growth. The EML 5 can be formed by applying a dispersion of the quantum dots QD in a solvent (dispersant) to an upper surface of the layer that is a lower layer of the EML 5 to form a coating film containing the quantum dots QD, and subsequently volatilizing the solvent described above to solidify (cure) the coating film described above. As the solvent described above, water or an organic solvent such as hexane or toluene can be used. The dispersion described above is separately patterned for each pixel P using a spin coating method, an ink-jet method, or the like. Note that the dispersion may be mixed with a dispersion material such as thiol and amine.

The dispersion described above is a colloidal solution including the quantum dots QD, ligands adsorbed (coordinated) on the surfaces of the quantum dots QD with the quantum dots QD as receptors, and the solvent described above. The ligand is a surface-modifying group that modifies the surface of the quantum dot QD. The surface of the quantum dot QD is protected by the ligand.

The EML 5 thus formed by the solvolysis method includes the quantum dots QD, each having a spherical shape, and the ligands. The quantum dot QD of the application type thus formed by the solvolysis method has a spherical shape instead of an island shape (lens shape) such as when formed by crystal growth, making it possible to reduce the polarization characteristics of light emission. Further, with the EML 5 including ligands, it is possible to suppress aggregation of the quantum dots QD during formation of an applied film including the quantum dots QD and favorably disperse the quantum dots QD.

The light-emitting device 100 includes the quantum dots QD of a plurality of types, and includes the quantum dots QD of the same type in the same pixel P. The EML 5R has a configuration in which a plurality of the quantum dots QR are layered, for example. The EML 5G has a configuration in which a plurality of the quantum dots QG are layered, for example. The EML 5B has a configuration in which a plurality of the quantum dots QB are layered, for example.

Figure 2:
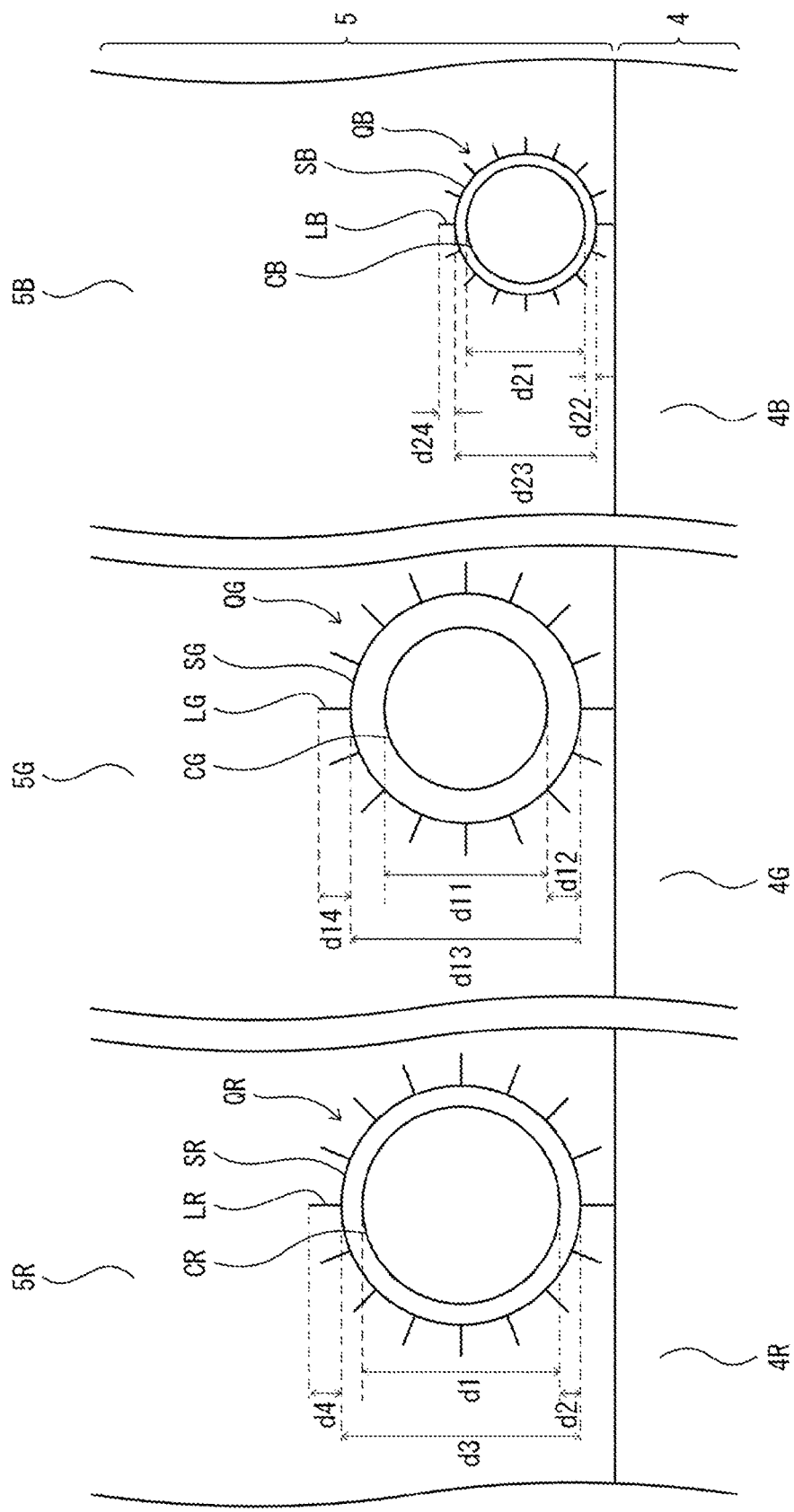
FIG. 2 is a cross-sectional view schematically illustrating an overall configuration of quantum dots and ligands included in each light-emitting layer of the light-emitting device according to the first embodiment.

FIG. 2 is a cross-sectional view schematically illustrating an overall configuration of the quantum dots QR, QG, QB and ligands LR, LG, LB included in the EMLs 5R, 5G, 5B of the light-emitting device 100.

The quantum dots QR, QG, QB as receptors used in the present embodiment are core-shell type quantum dots (core-shell particles), and are each a core-shell type quantum dot (core-shell particle) including a core and a shell covering the core.

As illustrated in FIG. 2, the quantum dot QR includes a core CR and a shell SR covering the core CR. Similarly, the quantum dot QG includes a core CG and a shell SG covering the core CG. The quantum dot QB includes a core CB and a shell SB covering the core CB.

Further, the EML 5R includes the ligand LR adsorbed on the surface of the quantum dot QR. The EML 5G includes the ligand LG adsorbed on the surface of the quantum dot QG. The EML 5B includes the ligand LB adsorbed on the surface of the quantum dot QB.

The quantum dots QR, QG, QB each may include, for example, at least one type of semiconductor material formed of an element of at least one type selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg).

As the shells SR, SG, SB, zinc sulfide (ZnS) is used, for example. As materials of the shells SR, SG, SB, materials having lattice constants similar to those of the cores CR, CG, CB covered by the shells SR, SG, SB are suitably used. In a case in which the lattice constants of the cores CR, CG, CB are compatible with the lattice constants of the shells SR, SG, SB covering the cores CR, CG, CB, a number of defects in the crystalline body can be reduced. Further, as the materials of the shells SR, SG, SB, desirably a shell material having a larger band gap than that of the material of the cores CR, CG, CB covered by the shells SR, SG, SB is used. By using such a material, it is possible to increase a photoluminescence quantum yield (PLQY) and thus protect an excited state. ZnS satisfies these requirements. However, the material of the shells SR, SG, SB is not limited to ZnS, and other suitable materials may be used.

Examples of combinations (core/shell) of the cores CR, CG, CB and the shells SR, SG, SB in each quantum dot QR, QG, QB include cadmium selenide (CdSe)/zinc selenide (ZnSe), CdSe/ZnS, cadmium sulfide (CdS)/ZnSe, CdS/ZnS, ZnSe/ZnS, indium phosphide (InP)/ZnS, or zinc oxide (ZnO)/magnesium oxide (MgO).

The ligands LR, LG, LB each consist of an adsorption group adsorbed (coordinated) on the surface of each quantum dot QR, QG, QB, and an alkyl group bonded to the adsorption group. Examples of the adsorption group described above include an amino group, a phosphine group, a carboxyl group, a hydroxyl group, and a thiol group. Further, examples of the alkyl group described above include an alkyl group having from 2 to 50 carbons.

Examples of the ligands LR, LG, LB include hexadecylamine, oleylamine, octylamine, hexadecanthiol, dodecanthiol, trioctylphosphine, trioctylphosphine oxide, myristic acid, and oleic acid. The ligands LR, LG, LB also serve as dispersing agents that improve a dispersibility of the quantum dots QR, QG, QB in the dispersions.

As a feature of the core-shell type quantum dot QD, a wavelength of light emitted by the core-shell type quantum dot QD is dependent on a particle size of the core that is a light-emitting portion and is independent of a particle size of the shell. A wavelength of light emitted by the quantum dots QR, QG, QB can be controlled according to the particle size of the cores CR, CG, CB of the quantum dots QR, QG, QB.

The quantum dot QD tends to lengthen in light emission wavelength as the particle size of the core that is the light-emitting portion is increased, and tends to shorten in the light emission wavelength as the particle size of the core is decreased.

As illustrated in FIG. 2, given d1 as the particle size (diameter size) of the core CR, d11 as the particle size (diameter size) of the core CG, and d21 as the particle size (diameter size) of the core CB, then d1>d11>d21. The particle sizes (hereinafter referred to as "core diameters") d1, d11, d21 of these cores CR, CG, CB need only be set as appropriate to obtain the desired light emission wavelengths depending on the materials of the cores CR, CG, CB, and are not particularly limited. These core diameters d1, d11, d21 can be set as in the related art.

The core diameters d1, d11, d21 described above are, for example, from 1 nm to 10 nm. The quantum dots QR, QG, QB emit light having a wavelength corresponding to the band gap (prohibited band width) and quantum level (excitation level) thereof. As described above, the quantum dots QR, QG, QB according to the present embodiment have spherical shapes and substantially uniform particle sizes. The quantum dots QR, QG, QB emit light having wavelengths corresponding to the core diameters d1, d11, d21 of the respective cores CR, CG, CB, which are the light-emitting portions.

Further, given d3 as an outermost particle size of the quantum dot QR including the shell SR, d13 as an outermost particle size of the quantum dot QG including the shell SG, and d23 as an outermost particle size of the quantum dot QB including the shell SB, these outermost particle sizes d3, d13 d23 are from 2 nm to 20 nm, for example. Layer thicknesses of the EMLs 5R, 5G, 5B are preferably about several times the outermost particle sizes d3, d13, d23 of each quantum dots QR, QG, QB, and a number of overlapping layers of each quantum dot QR, QG, QB in the EMLs 5R, 5G, 5B is from 1 to 9 layers, for example.

The core diameters d1, d11, d21 described above can be calculated from a quantum size effect by analyzing the materials of the cores CR, CG, CB. Further, the outermost particle sizes d43, d13, d23 described above can be measured from transmission electron microscope (TEM) images of cross sections of the EMLs 5R, 5G, 5B. Note that thicknesses of the shells SR, SG, SB and lengths of the ligands LR, LG, LB will be described below.

In the light-emitting elements 10R, 10G, 10B according to the present embodiment, layer thicknesses of layers other than the ILs 4R, 4G, 4B can be set as in light-emitting elements of the related art.

Table 2 shows the layer thickness of each layer in the light-emitting elements 10R, 10G, 10B according to the present embodiment. In Table 2, the layer thicknesses in parentheses indicate suitable ranges for the layer thickness of each layer. Further, the layer thicknesses outside the parentheses are the specific layer thicknesses of each layer in the light-emitting elements 10R, 10G, 10B used in the present embodiment and indicate examples of combinations of the layer thickness of each layer in the light-emitting elements 10R, 10G, 10B.

TABLE 2

|  | Layer thickness of each layer (nm) |
|---|---|
| Anode electrode | R: 100 (from 20 to 200)<br>G: 100 (from 20 to 200)<br>B: 100 (from 20 to 200) |

TABLE 2-continued

| | Layer thickness of each layer (nm) |
|---|---|
| HTL (Metal chalcogenide layer) | R: 50 (from 20 to 150) |
| | G: 50 (from 20 to 150) |
| | B: 50 (from 20 to 150) |
| IL | R: 6 (from 0 to 12) |
| | G: 6 (from 0 to 12) |
| | B: 8 (from 0.5 to 12.5) |
| EML | R: 40 (from 15 to 80) |
| | G: 40 (from 15 to 80) |
| | B: 40 (from 15 to 80) |
| ETL | 50 (from 20 to 150) |
| Cathode electrode | 100 (from 50 to 200) |

As shown in Table 2, layer thicknesses of the anodes 2R, 2G, 2B are preferably from 20 nm to 200 nm. Further, layer thicknesses of the HTLs 3R, 3G, 3B are preferably from 20 nm to 150 nm. A layer thickness of the IL 4R and a layer thickness of the IL 4G are preferably not greater than 12 nm. A layer thickness of the IL 4B is preferably from 0.5 nm to 12.5 nm. However, the ILs 4R, 4G, 4B are set so that the layer thickness of the IL 4B is greater than the layer thickness of the IL 4R and the layer thickness of the IL 4B is greater than the layer thickness of the IL 4G. The layer thicknesses of the EMLs 5R, 5G, 5B are preferably from 15 nm to 80 nm. A layer thickness of the ETL 6 is preferably from 20 nm to 150 nm. A layer thickness of the cathode 7 is preferably from 50 nm to 200 nm.

In the following, an example of a manufacturing method of the light-emitting elements 10R, 10G, 10B and the light-emitting device 100 according to the present embodiment will be described with reference to FIG. 1 and Table 2.

In the present embodiment, first, the array substrate 1 as a support body was prepared, and an ITO layer having a layer thickness of 100 nm was formed in a matrix shape on the array substrate 1 as the anodes 2R, 2G, 2B by sputtering (anode formation process).

Next, a bank having a lattice pattern (not illustrated) was formed as a pixel separation wall and edge cover, covering each edge of the anodes 2R, 2G, 2B (bank formation process).

Next, NiO layers having a layer thickness of 50 nm were respectively formed as the HTLs 3R, 3G, 3B by respectively spin coating NiO on the anodes 2R, 2G, 2B, and subsequently applying heat in the atmosphere (HTL formation process).

Next, PMMA layers were respectively formed as the ILs 4R, 4G, 4B on the HTLs 3R, 3G, 3B using a solution of PMMA dissolved in acetone by a spin coating method (IL formation process). Note that films were formed using a mask in areas other than the film formation area, and the layer thicknesses of the ILs 4R, 4G, 4B were adjusted by changing the concentration of the PMMA in the solution described above, the number of revolutions during spin coating, and the like. Thus, a PMMA layer having a layer thickness of 8 nm was formed as the IL 4B, and PMMA layers having a layer thickness of 6 nm were each formed as the IL 4R and the IL 4G.

Next, quantum dot QD layers having a layer thickness of 40 nm were formed as the EMLs 5R, 5G, 5B on the ILs 4R, 4G, 4B, respectively, by a spin coating method (EML formation process).

Next, a ZnO layer having a layer thickness of 50 nm and consisting of ZnO—NPs (nanoparticles) was formed as the ETL 6, covering the EMLs 5R, 5G, 5B and the bank described above as a common layer common to each pixel P by a spin coating method (ETL formation process). According to the present embodiment, by thus forming the ETL 6 using the same electron transport material in at least a portion of the light-emitting elements 10R, 10G, 10B, it is possible to make the ETL 6 a common layer in at least the portion of the light-emitting elements described above. According to the present embodiment, the ETL 6 can be formed more easily by making the material of the ETL 6 common to the light-emitting elements 10R, 10G, 10B as described above.

Next, an Al layer having a layer thickness of 100 nm was formed as the cathode 7 on the ETL 6 as a common layer common to each pixel P by a vacuum vapor deposition technique (cathode formation process).

In this manner, the light-emitting elements 10R, 10G, 10B according to the present embodiment were manufactured. The light-emitting device 100 according to the present embodiment is manufactured by sealing the light-emitting elements 10R, 10G, 10B by a sealing layer (not illustrated) after the cathode formation process described above.

Next, an effect of the light-emitting device 100 according to the present embodiment will be described.

As described above, in NPL 1, the distance from the carrier transport layer to the quantum dot core is shortened to improve the characteristics of the light-emitting element. On the other hand, in NPL 2, contrary to NPL 1, the distance from the carrier transport layer to the quantum dot core is lengthened to improve the characteristics of the light-emitting element.

For this reason, the inventors of the present application conducted extensive studies, which lead to the following conclusions. As described above, NPL 1 uses a common organic material for the hole injection layer and the hole transport layer. The reason for shortening the distance from the carrier transport layer to the quantum dot core in such a light-emitting element is presumably because it is more difficult for carriers to be injected from the carrier transport layer into the quantum dot core in blue quantum dots compared to red quantum dots and green quantum dots.

On the other hand, NPL 2 uses NiO for the hole transport layer as described above. NiO is a type of metal chalcogenide. The reason for lengthening the distance from the carrier transport layer to the quantum dot core in such a light-emitting element is presumably because the presence of a hydroxyl group on the metal chalcogenide surface charges the quantum dots, which degrades the characteristics of the light-emitting element.

However, according to the studies of the inventors of the present application, when a metal chalcogenide is used in a layer having hole transport properties and the thickness of the quantum dot shell of each light-emitting element differing in light emission wavelength is increased, the luminance of the light-emitting element that emits light in a wavelength band having the shortest light emission peak wavelength lowers, as described above.

Therefore, the inventors of the present application conducted further extensive studies. As a result, the inventors of the present application found that the problem described above can be solved by making the layer thickness of the intermediate layer between the EML and the layer composed of a metal chalcogenide in the light-emitting element that emits light in a wavelength band having the shortest light emission peak wavelength greater than the layer thicknesses of the corresponding intermediate layers of the other light-emitting elements. Therefore, in the present embodiment, the layer thicknesses of the ILs 4R, 4G, 4B are each set so that the layer thickness of the IL 4B is greater than the layer thickness of the IL 4R, and the layer thickness of the IL 4B is greater than the layer thickness of the IL 4G, as described above. The reason for the above will be described in more detail below with reference to FIG. 2 to FIG. 5.

Figure 3:
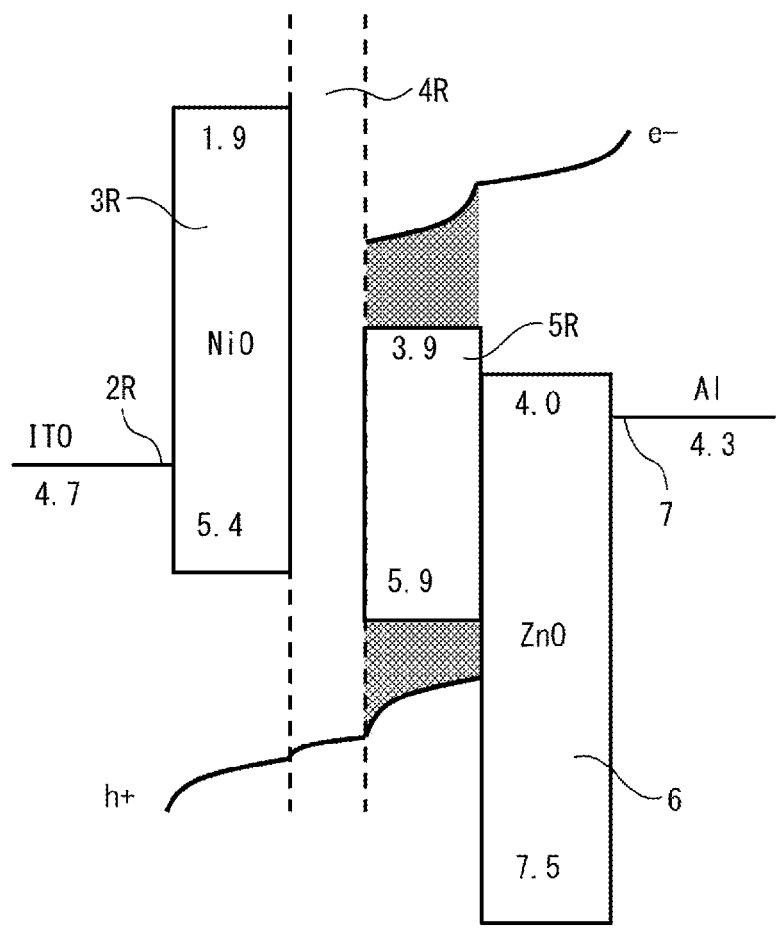
FIG. 3 is a diagram illustrating an energy band and a layer thickness of each layer of a red light-emitting element according to the first embodiment.
Figure 4:
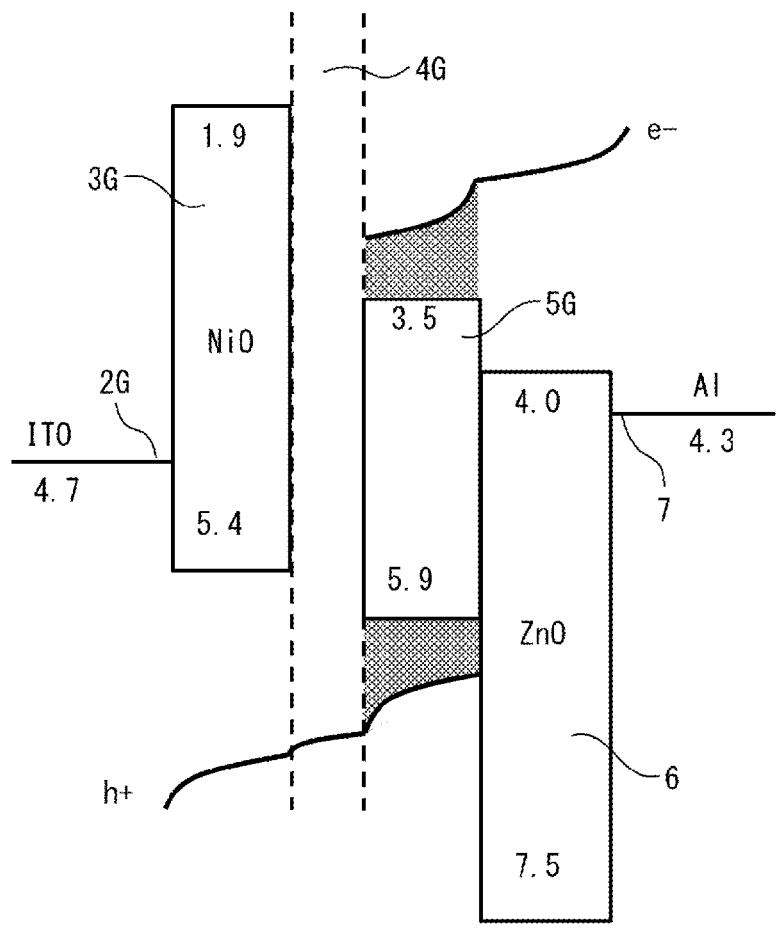
FIG. 4 is a diagram illustrating an energy band and a layer thickness of each layer in a green light-emitting element according to the first embodiment.
Figure 5:
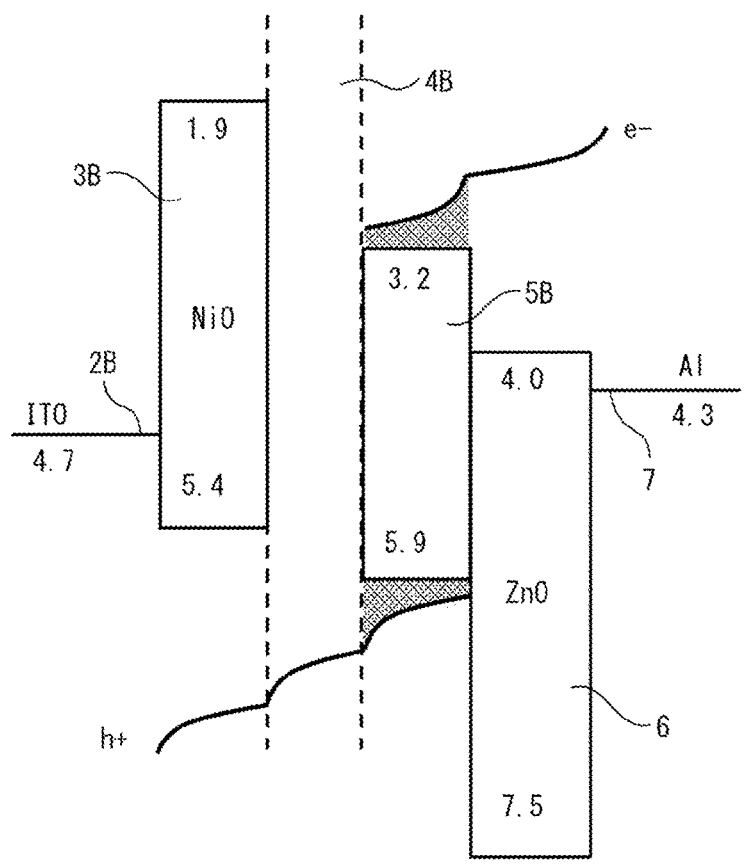
FIG. 5 is a diagram illustrating an energy band and a layer thickness of each layer of a blue light-emitting element according to the first embodiment.

FIG. 3 to FIG. 5 illustrate the energy bands and layer thicknesses of each layer in the light-emitting elements 10R, 10G, 10B according to the present embodiment manufactured by the method described above. FIG. 3 illustrates the energy band and the layer thickness of each layer in the light-emitting element 10R. FIG. 4 illustrates the energy band and the layer thickness of each layer in the light-emitting element 10G. FIG. 5 illustrates the energy band and the layer thickness of each layer in the light-emitting element 10B.

As illustrated in FIG. 3 to FIG. 5, the ITO layer as the anodes 2R, 2G, 2B has a Fermi level (hereinafter referred to as "$E_{F1}$") of 4.7 eV, and the Al layer as the cathode 7 has a Fermi level (hereinafter referred to as "$E_{F2}$") of 4.3 eV. Further, the NiO layer as the HTLs 3R, 3G, 3B has an electron affinity (hereinafter referred to as "$EA_{HTL}$") of 1.9 eV and an ionization potential (hereinafter referred to as "$IP_{HTL}$") of 5.4 eV. Further, the ZnO layer as the ETL 6 has an electron affinity (hereinafter referred to as "$EA_{ETL}$") of 4.0 eV and an ionization potential (hereinafter referred to as "$IP_{ETL}$") of 7.5 eV. Further, the quantum dot QD layer as the EML 5R has an electron affinity (hereinafter referred to as "$EA_{EMLR}$") of 5.9 eV and an ionization potential (hereinafter referred to as "$IP_{EMLR}$") of 3.9 eV. The quantum dot QD layer as the EML 5G has an electron affinity (hereinafter referred to as "$EA_{EMLG}$") of 5.9 eV, and an ionization potential (hereinafter referred to as "$IP_{EMLG}$") of 3.2 eV. The quantum dot QD layer as the EML 5B has an electron affinity (hereinafter referred to as "$EA_{EMLB}$") of 5.9 eV, and an ionization potential (hereinafter referred to as "$IP_{EMLB}$") of 3.2 eV. Further, the PMMA as the ILs 4R, 4G, 4B has an electron affinity $EA_{IL}$ of 2.6 eV, and an ionization potential $IP_{IL}$ of 5.8 eV, as shown in Table 1.

The electron affinity $EA_{HTL}$ corresponds to an energy difference between a vacuum level (not illustrated) and a conduction band minimum (CBM) of the HTLs 3R, 3G, 3B. The ionization potential $IP_{HTL}$ corresponds to an energy difference between the vacuum level described above and a valence band maximum (VBM) of the HTLs 3R, 3G, 3B. The electron affinity $EA_{IL}$ corresponds to an energy difference between the vacuum level described above and the CBM of the ILs 4R, 4G, 4B. The ionization potential $IP_{IL}$ corresponds to an energy difference between the vacuum level described above and the VBM of the ILs 4R, 4G, 4B. The electron affinity $EA_{EMLR}$ corresponds to an energy difference between the vacuum level described above and the CBM of the EML 5R. The ionization potential $IP_{EMLR}$ corresponds to an energy difference between the vacuum level described above and the VBM of the EML 5R. The electron affinity $EA_{EMLG}$ corresponds to an energy difference between the vacuum level described above and the CBM of the EML 5G. The ionization potential $IP_{EMLG}$ corresponds to an energy difference between the vacuum level described above and the VBM of the EML 5G. The electron affinity $EA_{EMLB}$ corresponds to an energy difference between the vacuum level described above and the CBM of the EML 5B. The ionization potential $IP_{EMLB}$ corresponds to an energy difference between the vacuum level described above and the VBM of the EML 5B. The electron affinity $EA_{ETL}$ corresponds to an energy difference between the vacuum level described above and the CBM of the ETL 6R.

The ionization potential $IP_{ETL}$ corresponds to an energy difference between the vacuum level described above and the VBM of the ETL 6.

As illustrated in FIG. 3 to FIG. 5, when a potential difference is applied between the cathode 7 and the anodes 2R, 2G, 2B in the light-emitting device 100, electrons are injected from the cathode 7 and positive holes are injected from the anodes 2R, 2G, 2B toward the EMLs 5R, 5G, 5B, respectively. As illustrated in FIG. 3 to FIG. 5 by e, the electrons from the cathode 7 reach the EMLs 5R, 5G, 5B via the ETL 6. On the other hand, as illustrated in FIG. 3 to FIG. 5 by h+, the positive holes from the anodes 2R, 2G, 2B reach the EMLs 5R, 5G, 5B via the HTLs 3R, 3G, 3B and the ILs 4R, 4G, 4B. The positive holes and the electrons that have reached the EMLs 5R, 5G, 5B are recombined at the quantum dots QR, QG, QB in the respective pixels RP, GP, BP to emit light. Light emitted from the quantum dots QR, QG, QB is, for example, reflected by the cathode 7, which is a metal electrode, transmitted through the anodes 2R, 2G, 2B, which are transparent electrodes, and irradiated outside of the light-emitting device 100.

In the light-emitting elements 10R, 10G, 10B, in a case in which the layer thicknesses of the ILs 4R, 4G, 4B are sufficiently thin, the positive holes move through the ILs 4R, 4G, 4B by tunneling.

A hole injection barrier from the HTL 3R to the EML 5R is indicated by an energy difference between the ionization potential $IP_{EMLR}$ of the EML 5R and the ionization potential $IP_{ETL}$ of the HTL 3R ($IP_{EMLR}-IP_{ETL}$). Similarly, a hole injection barrier from the HTL 3G to the EML 5G is indicated by an energy difference between the ionization potential $IP_{EMLG}$ of the EML 5G and the ionization potential $IP_{ETL}$ of the HTL 3R ($IP_{EMLG}-IP_{ETL}$). A hole injection barrier from the HTL 3B to the EML 5B is indicated by an energy difference between the ionization potential $IP_{EMLB}$ of the EML 5B and the ionization potential $IP_{ETL}$ of the HTL 3B ($IP_{EMLB}-IP_{ETL}$).

As illustrated in FIG. 3 to FIG. 5, in a case in which the same material is used, the VBMs of the quantum dot QD layers generally do not vary by the light emission wavelength of the quantum dots QD used as the quantum dots QR, QG, QB. Therefore, in a case in which the same material is used, the ionization potentials $IP_{EMLR}$, $IP_{EMLG}$, $IP_{EMLB}$ are substantially the same. This is because of the following reasons. For the quantum dots QR, QG, QB, the smaller the atomic number of the elements that make up the cores CR, CG, CB of these quantum dots QR, QG, QB, the fewer the closed-shell orbitals and the less likely the nuclei are shielded by the closed-shell orbitals. Therefore, the valence electrons of the quantum dots QR, QG, QB are readily affected by the electric fields created by the nuclei and tend to remain at a certain energy level.

Accordingly, in a case in which the same material is used, the quantum dot QD layers have substantially the same ionization potential, and the hole injection efficiencies into the quantum dot QD layers are independent of the light emission wavelength. In particular, in the examples illustrated in FIG. 3 to FIG. 5 the hole injection barriers from the HTLs 3R, 3G, 3B to the EMLs 5R, 5G, 5B are each small at 0.5 eV or less, and the hole injection efficiencies from the HTLs 3R, 3G, 3B into the EMLs 5R, 5G, 5B are high.

Nevertheless, as illustrated in FIG. 3 to FIG. 5, the CBMs of the quantum dot QD layers generally differ, depending on the light emission wavelength. Particularly, in a case in which the same material is used, the conduction band level of the quantum dots QD used as the quantum dots QR, QG, QB has a deeper energy level as a wavelength of light emitted from the quantum dots QD is longer, and has a lower energy level as a wavelength of light emitted from the quantum dots QD is shorter. This is because the quantum dots QD with a smaller band gap have a deeper conduction band level.

Accordingly, among the light-emitting elements 10R, 10G, 10B, the light-emitting element 10B that emits light in a wavelength band having the shortest light emission peak wavelength has a larger electron injection barrier than those of the other light-emitting elements 10R, 10G.

The electron injection barrier from the ETL 6 to the EML 5R is indicated by an energy difference between the electron affinity $EA_{ETL}$ of the ETL 6 and the electron affinity $EA_{EMLR}$ of the EML 5R ($EA_{ETL}-EA_{EMLR}$). The electron injection barrier from the ETL 6 to the EML 5G is indicated by an energy difference between the electron affinity $EA_{ETL}$ of the ETL 6 and the electron affinity $EA_{EMLG}$ of the EML 5G ($EA_{ETL}-EA_{EMLG}$). The electron injection barrier from the ETL 6 to the EML 5B is indicated by an energy difference between the electron affinity $EA_{ETL}$ of the ETL 6 and the electron affinity $EA_{EMLB}$ of the EML 5B ($EA_{ETL}-EA_{EMLB}$).

In the examples illustrated in FIG. 3 to FIG. 5, the electron injection barriers from the ETL 6 to the EML 5R, the EML 5G, and the EML 5B are, in order, 0.1 eV, 0.5 eV, and 0.8 eV, and injection of the electrons increases in difficulty in the order R→G→B. In particular, in the examples illustrated in FIG. 3 to FIG. 5, the electron injection barrier from the ETL 6 to the EML 5R and the EML 5G are each small at 0.5 eV or less, and the electron injection transport from the ETL 6 to the EMLs 5R, 5G is high. On the other hand, the electron injection barrier from the ETL 6 to the EML 5B is greater than 0.5 eV, and the light-emitting element 10B has a low electron injection efficiency compared to those of the other light-emitting elements 10R, 10G.

When the CBM of the EML 5B is thus shallower than the CBMs of the EMLs 5R, 5G, the injection of electrons into the light-emitting element 10B is more difficult than the injection of electrons into the other light-emitting elements 10R, 10G.

Therefore, in the present embodiment, the layer thickness of the IL 4B is made greater than the layer thickness of the ILs 4R, 4G, thereby suppressing the injection of positive holes into the EML 5B. Thus, in the light-emitting element 10B, a carrier balance between positive holes and electrons can be achieved, and the recombination probability of the positive holes and the electrons can be improved. As a result, the equivalent luminance can be obtained in the light-emitting element 10B as in the other light-emitting elements 10R, 10G.

Thus, according to the present embodiment, even when a metal chalcogenide is used in the HTL 3 as described above, it is possible to suppress equivalent charging in the light-emitting element 10B and the other light-emitting elements 10R, 10G. Further, a balance in luminance can be achieved between the light-emitting element 10B and the other light-emitting elements 10R, 10G.

Further, according to the present embodiment, by making the layer thickness of the IL 4B larger than the layer thicknesses of the ILs 4R, 4G, it is possible to achieve the equivalent carrier balance in the light-emitting element 10B as in the other light-emitting elements 10R, 10G. Thus, according to the present embodiment, it is not necessary to change the CBM of the ETL 6 by changing the material of the ETL 6 depending on the light-emitting element 10, and the ETL 6 can be made common.

Further, according to the present embodiment, with the IL 4 being provided as an intermediate layer between the HTL 3 and the EML 5 as described above, it is not necessary to consider the hole transport properties of the IL 4, making it possible to easily manage the hole transport properties of the light-emitting elements 10R, 10G, 10B during manufacture.

As described above, the layer thickness of the IL 4R and the layer thickness of the IL 4G are preferably not greater than 12 nm. The layer thickness of the IL 4B is preferably from 0.5 nm to 12.5 nm.

With the layer thickness of the IL 4B being no less than 0.5 nm, the IL 4B can be formed uniformly, and an in-plane variation of hole injection in the IL 4B can be suppressed. Further, when the layer thickness of the IL 4 is excessively thick, positive holes can no longer be transported from the HTL 3 to the EML 5 by tunneling. By making the layer thickness of the IL 4B having a layer thickness thicker than those of the IL 4R and the IL 4G 12.5 nm or less, it is possible to effectively inject positive holes into the EML 5B by tunneling, even with the IL 4B.

Further, in the present embodiment, in the light-emitting device 100, a difference between the layer thickness of the IL 4B in the light-emitting element 10B that emits light in a wavelength band having the shortest light emission peak wavelength, and the layer thicknesses of the ILs 4R, 4G of the other light-emitting elements 10R, 10G is desirably from 0.5 nm to 12.5 nm.

That is, given $T_{ILR}$, $T_{ILG}$, $T_{ILB}$ as the layer thickness of the IL 4R, the layer thickness of the IL 4G, and the layer thickness of the IL 4B in this order, then desirably $(T_{ILR}+0.5 \text{ nm}) \leq T_{ILB} \leq (T_{ILR}+12.5 \text{ nm})$ and $(T_{ILG}+0.5 \text{ nm}) \leq T_{ILB} \leq (T_{ILG}+12.5 \text{ nm})$.

Thus, by making the difference between the layer thicknesses of the IL 4B and the ILs 4R, 4G 0.5 nm or greater, it is possible to form the IL 4 with a significant difference between the light-emitting element 10B and the light-emitting elements 10R, 10G other than the light-emitting element 10B. That is, in the above formula, $(T_{ILR}+0.5 \text{ nm})$ and $(T_{ILG}+0.5 \text{ nm})$ are uniform films and indicate values of the lowest limit allowing film formation with a significant difference. Further, as described above, by making the difference in layer thickness between the IL 4B and the ILs 4R, 4G 12.5 nm or less, it is possible to effectively inject positive holes by tunneling from the HTL 3B into the EML 5B. That is, in the above formula, $(T_{ILR}+12.5 \text{ nm})$ and $(T_{ILG}+12.5 \text{ nm})$ indicate values of the desired upper limit allowing effective tunneling by the positive holes.

Note that, as described above, the layer thickness $T_{ILB}$ of the IL 4B is greater than the layer thickness $T_{ILR}$ of the IL 4R and the layer thickness $T_{ILG}$ of the IL 4G. Accordingly, the difference in layer thickness between the IL 4B and the ILs 4R, 4G is indicated by $T_{ILB}-T_{ILR}$ (where $T_{ILB}>T_{ILR}$) Or $T_{ILB}-T_{ILG}$ (where $T_{ILB}>T_{ILG}$).

Further, as described above, in the IL 4, preferably $EA_{IL} \leq EA_{EML}-0.5$ eV. Further, in the IL 4, preferably $IP_{IL} \geq IP_{EML}-0.5$ eV. In other words, given $EA_{ILB}$ as the electron affinity of the IL 4B and $IP_{ILB}$ as the ionization potential of the IL 4B, then preferably, in the IL 4B, $EA_{ILB} \leq EA_{EMLB}-0.5$ eV and $IP_{ILB} \geq IP_{EMLB}-0.5$ eV. Further, given $EA_{ILR}$ as the electron affinity of the IL 4R and $IP_{ILR}$ as the ionization potential of the IL 4R, then preferably, in the IL 4R, $EA_{ILR} \leq EA_{EMLR}-0.5$ eV and $IP_{ILR} \geq IP_{EMLR}-0.5$ eV. Further, given $EA_{ILG}$ as the electron affinity of the IL 4G and $IP_{ILG}$ as the ionization potential of the IL 4G, then preferably, in the IL 4G, $EA_{ILG} \leq EA_{EMLG}-0.5$ eV and $IP_{ILG} \geq IP_{EMLG}-0.5$ eV.

The ILs 4R, 4G, 4B described above satisfy all conditions described above.

Further, as illustrated in FIG. 2, given d2 as a shell thickness of the shell SR, d12 as a shell thickness of the shell SG, and d22 as a shell thickness of the shell SB, then desirably these shell thicknesses d2, d12, d22 satisfy d22<d2 and/or d22<d12. That is, the shell thickness d22 of the quantum dot QB in the light-emitting element 10B that emits light in a wavelength band having the shortest light emission peak wavelength is desirably thinner than the shell thicknesses d2, d12 of the quantum dots QR, QG in the other light-emitting elements 10R, 10G. As illustrated in FIG. 2, d2=d3−(d1×2). Similarly, d12=d13−(d11×2), and d22=d23−(d21×2). Thus, the shell thicknesses d2, d12, d22 can be easily calculated by subtracting the core diameters d1, d11, d21 from the outermost particle sizes d3, d13, d23.

Further, given d4 as a ligand length of the ligand LR, d14 as a ligand length of the ligand LG, and d24 as a ligand length of the ligand LB, then desirably the ligand lengths d4, d14, d24 satisfy d24<d4 and/or d24<d14. That is, the ligand length d24 of the quantum dot QB in the light-emitting element 10B that emits light in a wavelength band having the shortest light emission peak wavelength is desirably shorter than the ligand lengths d4, d14 in the other light-emitting elements 10R, 10G. The ligand lengths d4, d14, d24 can be measured by determining a distance between the quantum dots QD adjacent to each other in the same pixel P from TEM images of the cross sections of the EMLs 5R, 5G, 5B.

Table 3 summarizes the shell thicknesses d2, d12, d22 and the ligand lengths d4, d14, d24 for each of the quantum dots QR, QG, QB. In Table 3, the values in parentheses indicate suitable ranges for the shell thicknesses d2, d12, d22 and the ligand lengths d4, d14, d24. Further, the values outside the parentheses are the specific values of the shell thicknesses d2, d12, d22 and the ligand lengths d4, d14, d24 used in the present embodiment, and are examples of combinations of the shell thicknesses d2, d12, d22 and the ligand lengths d4, d14, d24.

TABLE 3

|  | Quantum dot QR | Quantum dot QG | Quantum dot QB |
|---|---|---|---|
| Shell thickness (nm) | 15 (from 1.5 to 5.0) | 2.4 (from 1.5 to 5.0) | 0.8 (from 0.5 to 3.0) |
| Ligand length (nm) | 2.3 (from 1.5 to 2.5) | 2.3 (from 1.5 to 2.5) | 1.2 (from 0.5 to 1.5) |

As shown in Table 3, the shell thicknesses d2, d12 of the quantum dots QR, QG are preferably from 1.5 nm to 5.0 nm, and the shell thickness d22 of the quantum dot QB is preferably from 0.5 nm to 3.0 nm. Further, the ligand lengths d4, d14 of the quantum dots QR, QG are preferably from 1.5 nm to 2.5 nm, and the ligand length d24 of the quantum dot QB is preferably from 0.5 nm to 1.5 nm.

To suppress the degradation of the characteristics of the quantum dot QD caused by the charging of the quantum dot QD by the presence of a hydroxyl group on the surface of the metal chalcogenide in the HTL 3, it is desirable to increase a distance from the HTL 3 to the core of quantum dot QD.

Nevertheless, as described above, the light-emitting element 10B has a low electron injection efficiency compared to those of the light-emitting elements 10R, 10G. Thus, in the present embodiment, the layer thickness $T_{ILB}$ of the IL 4B is made larger than the layer thickness $T_{ILR}$ of the IL 4R and the layer thickness $T_{ILG}$ of the IL 4G, thereby suppressing positive hole injection into the EML 5B and achieving carrier balance in the EML 5B. Therefore, the quantum dots QB of light-emitting element 10B are less likely to be injected by the carriers from the IL 4 and the ETL 6 in comparison to the quantum dots QR, QG of other light-emitting elements 10R, 10G.

Therefore, as described above, when the shell thickness d22 of the quantum dot QB is made thinner than the shell thicknesses d2, d12 of the quantum dots QR, QG, distances from the IL 4B and the ETL 6 to the core CB of the quantum dot QB can be shortened. Thus, it is possible to achieve the equivalent effective carrier injection into the quantum dot QB as into the quantum dots QR, QB, making it possible to improve light-emission characteristics.

Further, as described above, in a case in which the ligand length d24 of the quantum dot QB is made shorter than the ligand lengths d4, d14 of the quantum dots QR, QG as well, the distances from the IL 4B and the ETL 6 to the core CB of the quantum dot QB can be shortened. Accordingly, in this case as well, it is possible to achieve the equivalent effective carrier injection into the quantum dot QB as into the quantum dots QR, QB, making it possible to improve light-emission characteristics.

Modified Example

Note that, in the present embodiment, a case in which the ILs 4R, 4G, 4B are respectively provided to the light-emitting elements 10R, 10G, 10B has been described as an example. Nevertheless, as long as the IL 4B is provided, the IL 4R and the IL 4G need not necessarily be provided, and at least one of the layer thickness $T_{ILR}$ of the IL 4R and the layer thickness $T_{ILG}$ of the IL 4G may be 0 nm, as shown in Table 2.

That is, in the present embodiment, the layer thickness $T_{ILR}$ of the IL 4R can be rephrased as a distance between the HTL 3R, which is the layer including the metal chalcogenide, and the EML 5R in the light-emitting element 10R. Accordingly, the layer thickness $T_{ILR}$ of the IL 4R being 0 nm indicates that the distance between the HTL 3R and the EML 5R is 0 nm, and the HTL 3R and the EML 5R are in contact with each other.

Further, the layer thickness $T_{ILG}$ of the IL 4G can be rephrased as a distance between the HTL 3G, which is the layer including the metal chalcogenide, and the EML 5G in the light-emitting element 10G. Accordingly, the layer thickness $T_{ILG}$ of the IL 4G being 0 nm indicates that the distance between the HTL 3G and the EML 5G is 0 nm, and the HTL 3G and the EML 5G are in contact with each other.

Similarly, in the description above, the layer thickness $T_{ILB}$ of the IL 4B can be rephrased as a distance between the HTL 3B, which is the layer including the metal chalcogenide, and the EML 5B in the light-emitting element 10B.

Accordingly, the difference in layer thickness between the IL 4B and the IL 4R can be rephrased as a difference between the above-described distance between the HTL 3B and the EML 5B in the light-emitting element 10B and the above-described distance between the HTL 3R and the EML 5R in the light-emitting element 10R. Similarly, the difference in layer thickness between the IL 4B and the IL 4G can be rephrased as a difference between the above-described distance between the HTL 3B and the EML 5B in the light-emitting element 10B and the above-described distance between the HTL 3G and the EML 5G in the light-emitting element 10G.

Note that, as described above, in order to suppress the degradation of the characteristics of the quantum dot QD caused by the charging of the quantum dot QD when a metal chalcogenide is used for the HTL 3, the distance from the HTL 3 to the core of the quantum dot QD need only be lengthened. Accordingly, for the quantum dots QR, QG, at least one of the shell thicknesses d2, d12 of the quantum dots QR, QG and the ligand lengths d4, d14 of quantum dots QR, QG need only be set to the values within the numerical ranges shown in Table 3, for example. This makes it possible to suppress the degradation of characteristics in the quantum dots QR, QG caused by charging, unlike the quantum dot QB. Further, as described above, the quantum dots QR, QG, unlike the quantum dot QB, have high hole injection efficiency and electron injection efficiency. Accordingly, the IL 4R and the IL 4G need not necessarily be provided.

Further, as described above, in the present embodiment, a case in which the layer thickness $T_{ILB}$ of the IL 4B is greater than the layer thickness $T_{ILG}$ of the IL 4G that is equal to the layer thickness $T_{ILR}$ of the IL 4R was described as an example. Nevertheless, as described above, the injection of electrons increases in difficulty in the order of R→G→B. Accordingly, the layer thicknesses of the ILs 4R, 4G, 4B are set so that the layer thickness $T_{ILB}$ of the IL 4B is greater than the layer thickness $T_{ILG}$ of the IL 4G that is greater than the layer thickness $T_{ILR}$ of the IL 4R.

Second Embodiment

Differences from the first embodiment will be described in the present embodiment. Note that, for convenience of description, components having the same function as the components described in the first embodiment are designated by the same reference numbers, and descriptions thereof are omitted.

Figure 6:
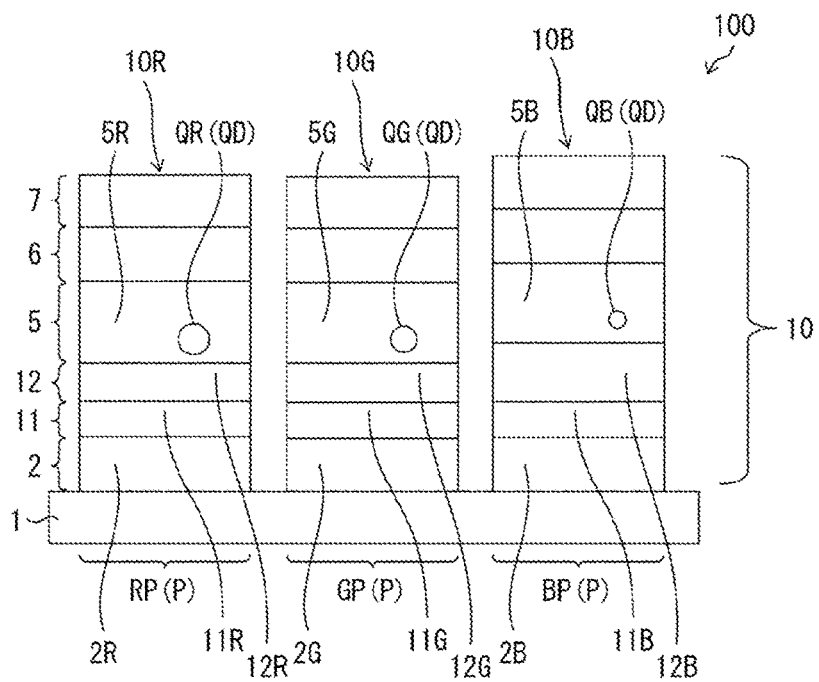
FIG. 6 is a cross-sectional view schematically illustrating an overall configuration of quantum dots and ligands included in each light-emitting layer of the light-emitting device according to a second embodiment.

FIG. 6 is a diagram schematically illustrating an example of a layered structure of the light-emitting device 100 according to the present embodiment.

The light-emitting element 10 and the light-emitting device 100 according to the present embodiment have the same configuration as those of the light-emitting element 10 and the light-emitting device 100 according to the first embodiment, except for the following points.

The light-emitting device 100 according to the present embodiment is provided with a hole injection layer (hereinafter referred to as "HIL") 11 as a layer having hole transport properties and including a metal chalcogenide between the anode 2 and the EML 5. Between the HIL 11 and the EML 5, an HTL 12 including an organic material is provided as an intermediate layer between the HIL 11 and the EML 5. Note that the HIL 11 mainly includes a metal chalcogenide, but may further include other materials. Further, the HTL 12 mainly includes an organic material, but may further include other materials.

The light-emitting element 10 illustrated in FIG. 6 includes the anode 2, the HIL 11, the HTL 12, the IL 4, the EML 5, the ETL 6, and the cathode 7 in this order from the array substrate 1 side (that is, lower layer side).

The anode 2, the HIL 11, the HTL 12, and the EML 5 are each separated into an island shape for each pixel P by a bank (not illustrated).

The light-emitting element 10R is formed by the anode 2R, an HIL 11R, an HTL 12R, and the EML 5R, each having an island shape, and the ETL 6 and the cathode 7, each being a common layer. The light-emitting element 10G is formed by the anode 2G, an HIL 11G, an HTL 12G, and the EML 5G, each having an island shape, and the ETL 6 and the cathode 7, each being a common layer. The light-emitting element 10B is formed by the anode 2B, an HIL 11B, an HTL 12B, and the EML 5B, each having an island shape, and the ETL 6 and the cathode 7, each being a common layer.

However, in the present embodiment as well, the configuration described above is an example, and the configuration of the light-emitting device 100 is not necessarily limited to the configuration described above. In the present embodiment as well, the light-emitting device 100 may include, as the light-emitting element 10, a light-emitting element that emits light having a light emission peak wavelength in a wavelength band other than the wavelength bands described in the first embodiment. The ETL 6 may be separated into an island shape for each pixel P by the bank described above. The layered order from the anode 2 to the cathode 7 may be reversed. Accordingly, the light-emitting element 10 may include the anode 2, the HIL 11, the HTL 12, the EML 5, the ETL 6, and the cathode 7 in this order from the upper layer side. Hereinafter, a case in which the light-emitting device 100 has the configuration illustrated in FIG. 6 will be described as an example.

Note that, in the following description, when there is no need to distinguish the HILs 11R, 11G, 11B from one another, these HILs 11R, 11G, 11B are collectively referred to simply as the "HIL 11". Further, when there is no need to distinguish the HTLs 12R, 12G, 12B from one another, these HTLs 12R, 12G, 12B are collectively referred to simply as the "HTL 12".

In the present embodiment, the anode 2 injects positive holes into the HIL 11. The HIL 11 injects positive holes into the HTL 12.

The HIL 11 is a layer having hole transport properties and mainly including a metal chalcogenide, as previously described. As the metal chalcogenide, the same material as that of the HTL 3 according to the first embodiment can be used. Further, the HIL 11 can be formed using the same method as that for the HTL 3 according to the first embodiment.

Specific examples of the metal chalcogenide described above include nickel oxide (for example, NiO), copper oxide (for example, $Cu_2O$), and copper sulfide (for example, CuS). One type of these metal chalcogenides may be used, or two or more types thereof may be mixed and used as appropriate. Accordingly, the metal chalcogenide described above is at least one type selected from the group consisting of nickel oxide, copper oxide, and copper sulfide.

The HIL 11 can be formed by, for example, a sol-gel method, sputtering, chemical vapor deposition (CVD), or a spin coating method (application method).

The HTL 12 is a layer that transports positive holes to the EML 5. The HTL 12 is provided between the HIL 11 and the EML 5, in contact with the HIL 11 and the EML 5.

The HTL 12 mainly contains organic materials having hole transport properties, such as poly(N-vinylcarbazole) (abbreviation: PVK) and poly[(9,9-dioctylfluorenyl-2,7-diyl)-co-(4,4'-(N-4-sec-butylphenyl))diphenylamine)] (abbreviation: TFB), for example. One type of these organic materials may be used, or two or more types thereof may be mixed and used as appropriate. Accordingly, the HTL 12 may include at least one type of organic hole transport material selected from the group consisting of PVK and TFB.

The HTL 12 can be formed by, for example, an application method (method of dissolving the organic hole transport material described above in a solvent, and spin coating and then drying the solvent) or a dip coating method.

Note that, in the present embodiment as well, from the perspective of the versatility of a manufacturing apparatus, desirably the manufacturing apparatuses of each layer in the light-emitting element 10 are separated from each other. Accordingly, desirably the manufacturing apparatus of the HIL 11 and the film formation apparatus used in the next process (that is, manufacturing apparatus of the layer formed on the HIL 11) are separated from each other. Nevertheless, when the HIL 11 is formed and subsequently the substrate on which the HIL 11 is formed is transported to the manufacturing apparatus separated from the manufacturing apparatus of the HIL 11, the substrate on which the HIL 11 is formed is exposed to the atmosphere between the two manufacturing apparatuses.

Thus, although the manufacturing process of the light-emitting device 100 includes a process in which the metal chalcogenide surface of the HIL 11 is exposed to a gas containing moisture, from the standpoint of the versatility of the manufacturing apparatus, desirably the manufacturing apparatuses of each layer in the light-emitting element 10 are separated from each other. Then, in the process in which the metal chalcogenide surface of the HIL 11 is exposed to a gas containing moisture, the hydroxyl group is presumably adsorbed on the surface of the metal chalcogenide. Accordingly, the manufacturing process of the light-emitting device 100 including a process in which the metal chalcogenide surface of the HIL 11 is exposed to a gas containing moisture presumably means that the manufacturing process of the light-emitting device 100 includes a process in which a hydroxyl group is adsorbed on the surface of the metal chalcogenide.

The HTL 12 suppresses the charging of the quantum dots QD by the hydroxyl group on the metal chalcogenide surface, and suppresses a decrease in light-emission characteristics caused by the charging of the quantum dots QD.

In the light-emitting elements 10R, 10G, 10B according to the present embodiment, the layer thicknesses of the layers other than the HTLs 12R, 12G, 12B can be set as in light-emitting elements of the related art.

Table 4 shows the layer thickness of each layer in the light-emitting elements 10R, 10G, 10B according to the present embodiment. In Table 4, the layer thicknesses in parentheses indicate suitable ranges for the layer thickness of each layer. Further, the layer thicknesses outside the parentheses are the specific layer thicknesses of each layer in the light-emitting elements 10R, 10G, 10B used in the present embodiment and indicate examples of combinations of the layer thickness of each layer in the light-emitting elements 10R, 10G, 10B.

TABLE 4

| | Layer thickness of each layer (nm) |
|---|---|
| Anode electrode | R: 100 (from 20 to 200) |
| | G: 100 (from 20 to 200) |
| | B: 100 (from 20 to 200) |
| HIL | R: 15 (from 5 to 50) |
| (Metal chalcogenide layer) | G: 15 (from 5 to 50) |
| | B: 15 (from 5 to 50) |
| HTL | R: 30 (from 30 to 59.5) |
| | G: 30 (from 30 to 59.5) |
| | B: 40 (from 30.5 to 60) |
| EML | R: 40 (from 15 to 80) |
| | G: 40 (from 15 to 80) |
| | B: 40 (from 15 to 80) |
| ETL | 50 (from 20 to 150) |
| Cathode electrode | 100 (from 50 to 200) |

As shown in Table 4, layer thicknesses of the HILs 11R, 11G, 11B are preferably from 5 nm to 50 nm. Further, layer thicknesses of the HTLs 12R, 12G are preferably from 30 nm to 59.5 nm. The layer thickness of the HTL 12B is preferably from 30.5 nm to 60 nm. However, the HTLs 12R, 12G, 12B are set so that the layer thickness of the HTL 12B is greater than the layer thickness of the HTL 12R and the layer thickness of the HTL 12B is greater than the layer thickness of the HTL 12G.

In the following, an example of a manufacturing method of the light-emitting elements 10R, 10G, 10B and the light-emitting device 100 according to the present embodiment will be described with reference to FIG. 6 and Table 4.

In the present embodiment, the processes up to formation of the bank having a lattice pattern are the same as those in the first embodiment. In the present embodiment as well, as in the first embodiment, ITO layers having a layer thickness of 100 nm were formed as the anodes 2R, 2G, 2B on the array substrate 1, and subsequently the bank having a lattice pattern was formed.

In the present embodiment, next, NiO layers having a layer thickness of 15 nm were respectively formed as the HILs 11R, 11G, 11B by respectively spin coating NiO on the anodes 2R, 2G, 2B, and subsequently applying heat in the atmosphere (HIL formation process).

Next, PVK layers were respectively formed as the HTLs 12R, 12G, 12B on the HILs 11R, 11G, 11B by dissolving PVK in a solvent and spin coating and drying the solvent (HTL formation process). Note that, films were deposited using a mask in areas other than the film formation area, and the layer thicknesses of the HTLs 12R, 12G, 12B were adjusted by changing the concentration of the PVK with respect to the solvent described above, the number of revolutions during spin coating, and the like. Thus, a PVK layer having a layer thickness of 40 nm was formed as the HTL 12B, and PVK layers having a layer thickness of 30 nm were formed as the HTL 12R and the HTL 12G.

Next, quantum dot QD layers having a layer thickness of 40 nm were formed on the HTLs 12R, 12G, 12B as the EMLs 5R, 5G, 5B in the same manner as in the first embodiment.

Subsequently, in the same manner as in the first embodiment, the ZnO layer composed of ZnO—NP and having a layer thickness of 50 nm, and the Al layer having a layer thickness of 100 nm were formed in this order, layering the ETL 6 and the cathode 7 common to each pixel P in this order. In this manner, the light-emitting elements 10R, 10G, 10B according to the present embodiment were manufactured. Note that, in the present embodiment as well, the light-emitting device 100 is manufactured by sealing the light-emitting elements 10R, 10G, 10B by a sealing layer (not illustrated) after formation of the cathode 7 described above.

Figure 7:
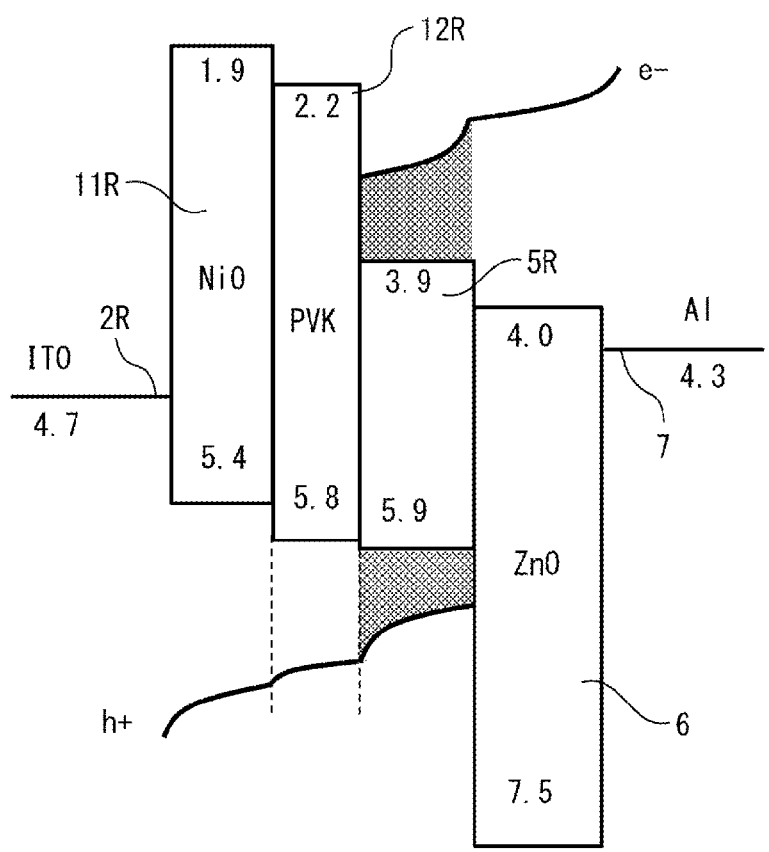
FIG. 7 is a diagram illustrating the energy band and the layer thickness of each layer of the red light-emitting element according to the second embodiment.
Figure 8:
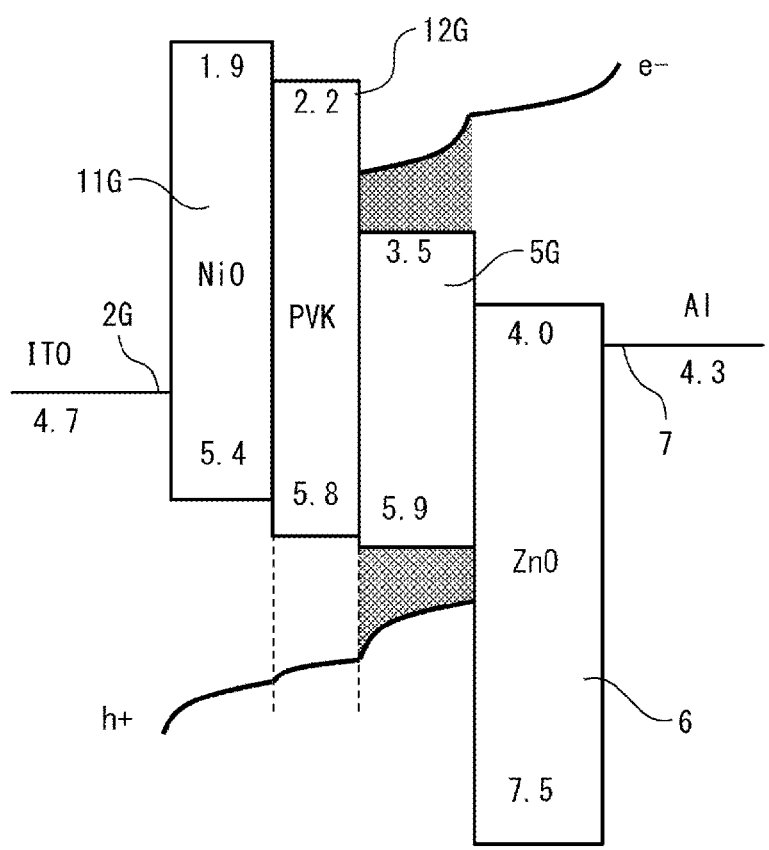
FIG. 8 is a diagram illustrating the energy band and the layer thickness of each layer in the green light-emitting element according to the second embodiment.
Figure 9:
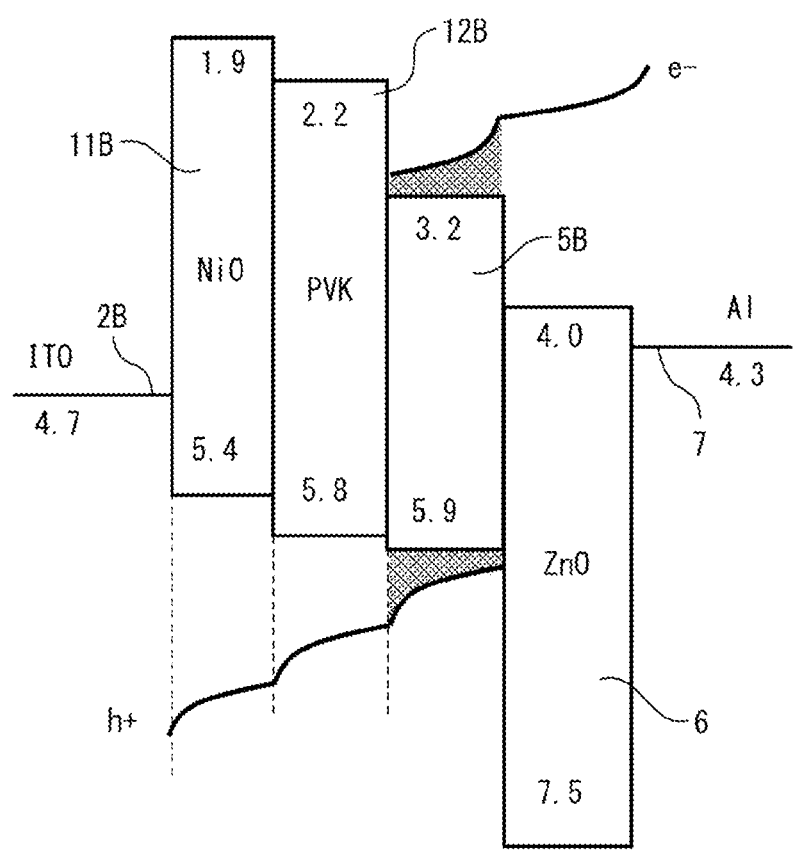
FIG. 9 is a diagram illustrating the energy band and the layer thickness of each layer of the blue light-emitting element according to the second embodiment.

FIG. 7 to FIG. 9 illustrate the energy bands and layer thicknesses of each layer in the light-emitting elements 10R, 10G, 10B according to the present embodiment, thus manufactured. FIG. 7 illustrates the energy band and the layer thickness of each layer in the light-emitting element 10R. FIG. 8 illustrates the energy band and the layer thickness of each layer in the light-emitting element 10G. FIG. 9 illustrates the energy band and the layer thickness of each layer in the light-emitting element 10B.

As illustrated in FIG. 7 to FIG. 9, the difference between the light-emitting elements 10R, 10G, 10B according to the present embodiment and the light-emitting elements 10R, 10G, 10B according to the first embodiment is only the layers between the anodes 2R, 2G, 2B and the EMLs 5R, 5B, 5B. In the present embodiment, as illustrated in FIG. 7 to FIG. 9, the HILs 11R, 11G, 11B and the HTLs 12R, 12G, 12B are provided in this order between the anodes 2R, 2G, 2B and the EMLs 5R, 5G, 5B. The NiO layers as the HILs 11R, 11G, 11B have an electron affinity (hereinafter referred to as "$EA_{HIL}$") of 1.9 eV, and an ionization potential (hereinafter referred to as "$IP_{HIL}$") of 5.4 eV. Further, the PVK layers as the HTLs 12R, 12G, 12B have an electron affinity $EA_{HTL}$ of 2.2 eV, and an ionization potential $IP_{HTL}$ of 5.8 eV.

The electron affinity $EA_{HIL}$ corresponds to an energy difference between a vacuum level (not illustrated) and the CBM of the HILs 11R, 11G, 11B. The ionization potential $IP_{HIL}$ corresponds to an energy difference between the vacuum level described above and the VBM of the HILs 11R, 11G, 11B. Further, in the present embodiment, the electron affinity $EA_{HTL}$ corresponds to an energy difference between a vacuum level (not illustrated) and the CBM of the HTLs 12R, 12G, 12B. The ionization potential $IP_{HTL}$ corresponds to an energy difference between the vacuum level described above and the VBM of the HTLs 12R, 12G, 12B.

In the present embodiment, as indicated by h+ in FIG. 7 to FIG. 9, positive holes from the anodes 2R, 2G, 2B reach the EMLs 5R, 5G, 5B via the HILs 11R, 11G, 11B and the HTLs 12R, 12G, 12B.

As described in the first embodiment, in a case in which the same material is used, the conduction band level of the quantum dots QD used as the quantum dots QR, QG, QB has a deeper energy level as a wavelength of light emitted from the quantum dots QD is longer, and has a lower energy level as a wavelength of light emitted from the quantum dots QD is shorter.

Then, when the CBM of the EML 5B is shallower than the CBMs of the EMLs 5R, 5G, the injection of electrons into the light-emitting element 10B is more difficult than the injection of electrons into the other light-emitting elements 10R, 10G.

Therefore, as illustrated in FIG. 7 to FIG. 9, in the present embodiment as well, among the light-emitting elements 10R, 10G, 10B, the light-emitting element 10B that emits light in a wavelength band having the shortest light emission peak wavelength has a larger electron injection barrier than those of the other light-emitting elements 10R, 10G.

Therefore, in the present embodiment, as described above, the layer thickness of the HTL 12B is greater than the layer thicknesses of the HTLs 12R, 12G. A hole mobility of organic materials is lower than a hole mobility of inorganic materials (metal chalcogenides). Therefore, the layer thickness of the HTL 12B is greater than the layer thicknesses of the HTLs 12R, 12G, making it possible to suppress the injection of positive holes into the EML 5B. Accordingly, in the present embodiment as well, in the light-emitting element 10B, a carrier balance between positive holes and electrons can be achieved, and the recombination probability between the positive holes and the electrons can be improved. As a result, the equivalent luminance can be obtained in the light-emitting element 10B as in the other light-emitting elements 10R, 10G.

Thus, according to the present embodiment, even when a metal chalcogenide is used in the HIL 11 as described above, it is possible to suppress equivalent charging between the light-emitting element 10B and the other light-emitting elements 10R, 10G. Further, a balance in luminance can be achieved between the light-emitting element 10B and the other light-emitting elements 10R, 10G.

Further, according to the present embodiment, by making the layer thickness of the HTL 12B larger than the layer thicknesses of the HTLs 12R, 12G, the same carrier balance can be achieved in the light-emitting element 10B as in the other light-emitting elements 10R, 10G. Thus, in the present embodiment as well, it is not necessary to change the CBM of the ETL 6 by changing the material of the ETL 6 depending on the light-emitting element 10, and the ETL 6 can be made common.

Further, according to the present embodiment, the HTL 12 is provided as an intermediate layer between the HIL 11 and the EML 5 as described above, making it possible to easily control the layer thickness during the manufacture of the HTL 12.

As described above, the layer thicknesses of the HTLs 12R, 12G are preferably from 30 nm to 59.5 nm. The layer thickness of the HTL 12B is preferably from 30.5 nm to 60 nm.

The suitable layer thickness of the HTL 12 is several tens of nm or greater, and favorable hole transport properties can be obtained by setting the lower limit of the layer thicknesses of the HTLs 12R, 12G, which is the lower limit of the layer thickness of the HTL 12, to 30 nm. Further, to suppress an increase in power consumption of the light-emitting device 100, a drive voltage is preferably 15 V or less. For example, when the layer thickness of the HTL 12 is increased by 12 nm, the voltage to obtain the same luminance is 3 V higher. Therefore, the upper limit of the layer thickness of the HTL 12, which is the upper limit of the layer thickness of the HTL 12B, is desirably 60 nm.

Further, in the present embodiment, in the light-emitting device 100, a difference between the layer thickness of the HTL 12B in the light-emitting element 10B that emits light in a wavelength band having the shortest light emission peak wavelength, and the layer thicknesses of the HTLs 12R, 12G of the other light-emitting elements 10R, 10G is desirably from 0.5 nm to 30 nm.

That is, given $T_{HTLR}$, $T_{HTLG}$, $T_{HTLB}$ as the layer thickness of the HTL 12R, the layer thickness of the HTL 12G, and the layer thickness of the HTL 12B in this order, then desirably $(T_{HTLR}+0.5\ nm) \leq T_{HTLB} \leq (T_{HTLR}+30\ nm)$ and $(T_{HTLG}+0.5\ nm) \leq T_{HTLB} \leq (T_{HTLG}+30\ nm)$.

Thus, by making the difference between the layer thicknesses of the HTL 12B and the HTLs 12R, 12G 0.5 nm or greater, it is possible to form the HTL 12 with a significant difference between the light-emitting element 10B and the light-emitting elements 10R, 10G other than the light-emitting element 10B. That is, in the above formula, $(T_{HTLR}+0.5\ nm)$ and $(T_{HTLG}+0.5\ nm)$ are uniform films, and indicate values of the lowest limit allowing film formation with a significant difference. On the other hand, as described above, by making the difference in layer thickness between the HTL 12B and the HTLs 12R, 12G 30 nm or less, it is possible to effectively transport positive holes from the HIL 11B to the EML 5B. That is, in the above formula, $(T_{HTLR}+30\ nm)$ and $(T_{HTLG}+30\ nm)$ indicate the values of the desired upper limits allowing achievement of favorable hole transport properties.

Note that, as described above, the layer thickness $T_{HTLB}$ of the HTL 12B is greater than the layer thickness $T_{HTLR}$ of the HTL 12R and the layer thickness $T_{HTLG}$ of the HTL 12G. Accordingly, the difference in layer thickness between the HTL 12B and the HTLs 12R. 12G is indicated by $T_{HTLB}-T_{HTLR}$ (where $T_{HTLB}>T_{HTLR}$) OR $T_{HTLB}-T_{HTLG}$ (where $T_{HTLB}>T_{HTLG}$).

Modified Example

As described above, in the present embodiment, a case in which the layer thickness $T_{HTLB}$ of the HTL 12B is greater than the layer thickness $T_{HTLG}$ of the HTL 12G that is equal to the layer thickness $T_{HTLR}$ of the HTL 12R was described as an example. Nevertheless, as described above, the injection of electrons increases in difficulty in the order of R→G→B. Accordingly, the layer thicknesses of the HTLs 12R, 12G, 12B are set so that the layer thickness $T_{HTLB}$ of the HTL 12B is greater than the layer thickness $T_{HTLG}$ of the HTL 12G that is greater than the layer thickness $T_{HTLR}$ of the HTL 12R.

Note that, in the present embodiment, the layer thickness $T_{HTLB}$ of the HTL 12B can be rephrased as a distance between the HIL 11B, which is the layer including the metal chalcogenide, and the EML 5B in the light-emitting element 10B. Further, the layer thickness $T_{HTLR}$ of the HTL 12R can be rephrased as a distance between the HIL 11R, which is the layer including the metal chalcogenide, and the EML 5R in the light-emitting element 10R. Similarly, the layer thickness $T_{HTLG}$ of the HTL 12G can be rephrased as a distance between the HIL 11G, which is the layer including the metal chalcogenide, and the EML 5G in the light-emitting element 10G.

Further, the difference in layer thickness between the HTL 12B and the HTL 12R can be rephrased as a difference between the above-described distance between the HIL 11B and the EML 5B in light-emitting element 10B and the above-described distance between the HIL 11R and the EML 5R in light-emitting element 10R. Similarly, the difference in layer thickness between the HTL 12B and the HTL 12G can be rephrased as a difference between the above-described distance between the HIL 11B and the EML5 in the light-emitting element 10B and the above-described distance between the HIL 11G and the EML 5G in the light-emitting element 10G.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A light-emitting device comprising:
a plurality of types of light-emitting elements each having a light emission peak wavelength in a different wavelength band,
wherein the plurality of types of light-emitting elements each include, in this order,
an anode,
a light-emitting layer including quantum dots, and
a cathode,
a layer having hole transport properties and including a metal chalcogenide being between the anode and the light-emitting layer, and
an intermediate layer including an organic material being between the light-emitting layer and at least the layer including the metal chalcogenide of, among the plurality of types of light-emitting elements, a light-emitting element that emits light in a wavelength band having the shortest light emission peak wavelength, and
a distance between the light-emitting layer and the layer including the metal chalcogenide of, among the plurality of types of light-emitting elements, the light-emitting element that emits light in a wavelength band having the shortest light emission peak wavelength is greater than a distance between the light-emitting layer and the layer including the metal chalcogenide of each of the other light-emitting elements,
wherein the intermediate layer is provided between the light-emitting layer and the layer including the metal chalcogenide in each of the plurality of types of light-emitting elements.

2. The light-emitting device according to claim 1,
wherein the metal chalcogenide is at least one type selected from the group consisting of nickel oxide, copper oxide, and copper sulfide.

3. The light-emitting device according to claim 1,
wherein the intermediate layer is an insulating layer.

4. The light-emitting device according to claim 3,
wherein the distance between the light-emitting layer and the layer including the metal chalcogenide of the light-emitting element that emits light in a wavelength band having the shortest light emission peak wavelength is within a range from 0.5 nm to 12.5 nm.

5. The light-emitting device according to claim 3,
wherein a difference between the distance between the light-emitting layer and the layer including the metal chalcogenide of the light-emitting element that emits light in a wavelength band having the shortest light emission peak wavelength and the distance between the light-emitting layer and the layer including the metal chalcogenide of each of the other light-emitting elements is within a range from 0.5 nm to 12.5 nm.

6. The light-emitting device according to claim 3,
wherein the insulating layer is composed of at least one type of insulating material selected from the group consisting of polymethyl methacrylate, polyvinyl pyrrolidone, and poly[(9,9-bis(3'-(N,N-dimethylamino)propyl)-2,7-fluorene)-alt-2,7-(9,9-dioctylfluorene)].

7. The light-emitting device according to claim 1,
wherein the layer including the metal chalcogenide is a hole injection layer, and
the intermediate layer is a hole transport layer.

8. The light-emitting device according to claim 7,
wherein the distance between the light-emitting layer and the layer including the metal chalcogenide of the light-emitting element that emits light in a wavelength band having the shortest light emission peak wavelength is within a range from 30.5 nm to 60 nm.

9. The light-emitting device according to claim 7,
wherein the difference between the distance between the light-emitting layer and the layer including the metal chalcogenide of the light-emitting element that emits light in a wavelength band having the shortest light emission peak wavelength and the distance between the light-emitting layer and the layer including the metal chalcogenide of each of the other light-emitting elements is within a range from 0.5 nm to 30 nm.

10. The light-emitting device according to claim 7,
wherein the hole transport layer includes at least one type of organic hole transport material selected from the group consisting of poly(N-vinylcarbazole) and poly[(9,9-dioctylfluorenyl-2,7-diyl)-co-(4,4'-(N-4-sec-butylphenyl))diphenylamine)].

11. The light-emitting device according to claim 1,
wherein the quantum dots of the plurality of types of light-emitting elements each include a core and a shell covering the core, and
a thickness of the shell of the quantum dots of the light-emitting element that emits light in a wavelength band having the shortest light emission peak wavelength is thinner than a thickness of the shell of the quantum dots of each of the other light-emitting elements.

12. The light-emitting device according to claim 1,
wherein the light-emitting layer of each of the plurality of types of light-emitting elements includes a ligand adsorbed on a surface of each of the quantum dots, and
a length of the ligand in the light-emitting element that emits light in a wavelength band having the shortest light emission peak wavelength is shorter than a length of the ligand in each of the other light-emitting elements.

13. The light-emitting device according to claim 1,
wherein the plurality of types of light-emitting elements each include an electron transport layer between the cathode and the light-emitting layer, and
a material of the electron transport layer in the light-emitting element that emits light in a wavelength band having the shortest light emission peak wavelength is the same as a material of the electron transport layer in at least a portion of light-emitting elements of the other light-emitting elements.

14. The light-emitting device according to claim 1,
wherein a level of a conduction band lower end of the light-emitting layer in the light-emitting element that emits light in a wavelength band having the shortest light emission peak wavelength is shallower than a level of a conduction band lower end of the light-emitting layer of each of the other light-emitting elements.

15. The light-emitting device according to claim 1,
wherein the light-emitting element that emits light in a wavelength band having the shortest light emission peak wavelength is a light-emitting element that emits blue light, and
the other light-emitting elements are a light-emitting element that emits red light and a light-emitting element that emits green light.

16. A light-emitting device comprising:
a plurality of types of light-emitting elements each having a light emission peak wavelength in a different wavelength band,
wherein the plurality of types of light-emitting elements each include, in this order,
an anode,
a light-emitting layer including quantum dots, and
a cathode,
a layer having hole transport properties and including a metal chalcogenide being between the anode and the light-emitting layer, and
an intermediate layer including an organic material being between the light-emitting layer and at least the layer including the metal chalcogenide of, among the plurality of types of light-emitting elements, a light-emitting element that emits light in a wavelength band having the shortest light emission peak wavelength, and
a distance between the light-emitting layer and the layer including the metal chalcogenide of, among the plurality of types of light-emitting elements, the light-emitting element that emits light in a wavelength band having the shortest light emission peak wavelength is greater than a distance between the light-emitting layer and the layer including the metal chalcogenide of each of the other light-emitting elements,
wherein the intermediate layer is an insulating layer.

17. The light-emitting device according to claim 16,
wherein the distance between the light-emitting layer and the layer including the metal chalcogenide of the light-emitting element that emits light in a wavelength band having the shortest light emission peak wavelength is within a range from 0.5 nm to 12.5 nm.

18. The light-emitting device according to claim 16,
wherein a difference between the distance between the light-emitting layer and the layer including the metal chalcogenide of the light-emitting element that emits light in a wavelength band having the shortest light emission peak wavelength and the distance between the light-emitting layer and the layer including the metal chalcogenide of each of the other light-emitting elements is within a range from 0.5 nm to 12.5 nm.

19. The light-emitting device according to claim 16,
wherein the insulating layer is composed of at least one type of insulating material selected from the group consisting of polymethyl methacrylate, polyvinyl pyrrolidone, and poly[(9,9-bis(3'-(N,N-dimethylamino)propyl)-2,7-fluorene)-alt-2,7-(9,9-dioctylfluorene)].

* * * * *